(12) United States Patent
Kumagai

(10) Patent No.: US 7,519,935 B2
(45) Date of Patent: Apr. 14, 2009

(54) CIRCUIT DIAGRAM DRAFTING SYSTEM AND METHOD AND COMPUTER PROGRAM PRODUCT

(75) Inventor: Yoshitomo Kumagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 170 days.

(21) Appl. No.: 11/420,371

(22) Filed: May 25, 2006

(65) Prior Publication Data
US 2007/0204254 A1    Aug. 30, 2007

(30) Foreign Application Priority Data
Feb. 27, 2006    (JP) .............................. 2006-051037

(51) Int. Cl.
*G06F 17/50*    (2006.01)
(52) U.S. Cl. .............................. 716/12; 716/1; 716/11; 716/18
(58) Field of Classification Search .............. 716/1, 716/11, 12, 18
See application file for complete search history.

(56) References Cited

U.S. PATENT DOCUMENTS 7,168,041 B1 *    1/2007    Durrill et al. ............... 715/700

FOREIGN PATENT DOCUMENTS

| JP | 5-225286 | 9/1993 |
| JP | 5-314200 | 11/1993 |

* cited by examiner

*Primary Examiner*—Thuan Do
(74) *Attorney, Agent, or Firm*—Fujitsu Patent Center

(57) ABSTRACT

A circuit diagram drafting system for drafting a circuit diagram comprised of a plurality of circuit components and connections connecting terminals of the circuit components, the circuit diagram drafting system provided with a display unit for displaying the circuit diagram and a managing unit for attaching and managing a line marker on connections of the circuit diagram displayed on the display unit based on a set unit selected from a predetermined plurality of line marker set units, and a circuit diagram drafting method and computer program relating to the same.

15 Claims, 29 Drawing Sheets

—o OSCAI

CONFIRM SELECTION  Space
CANCEL           Esc
MOVE ITEM
ZOOM IN/OUT ITEM
JUMP

—o OSCAI (002-7,G)
(032-2,F)
(103-4,D)

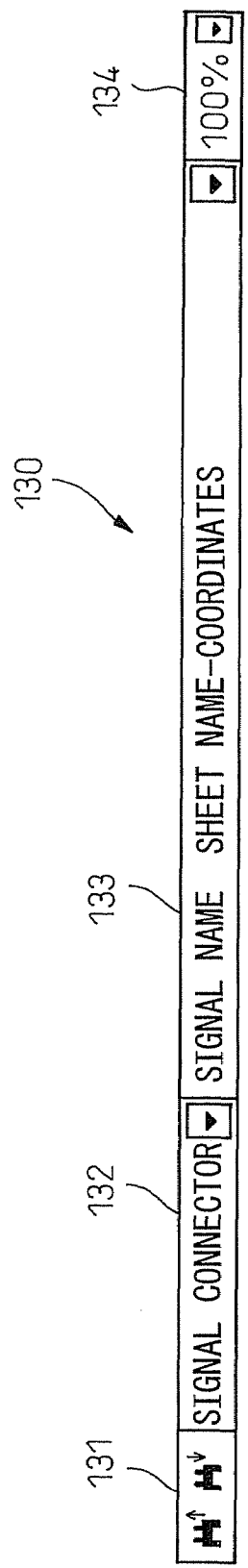

FIG.14
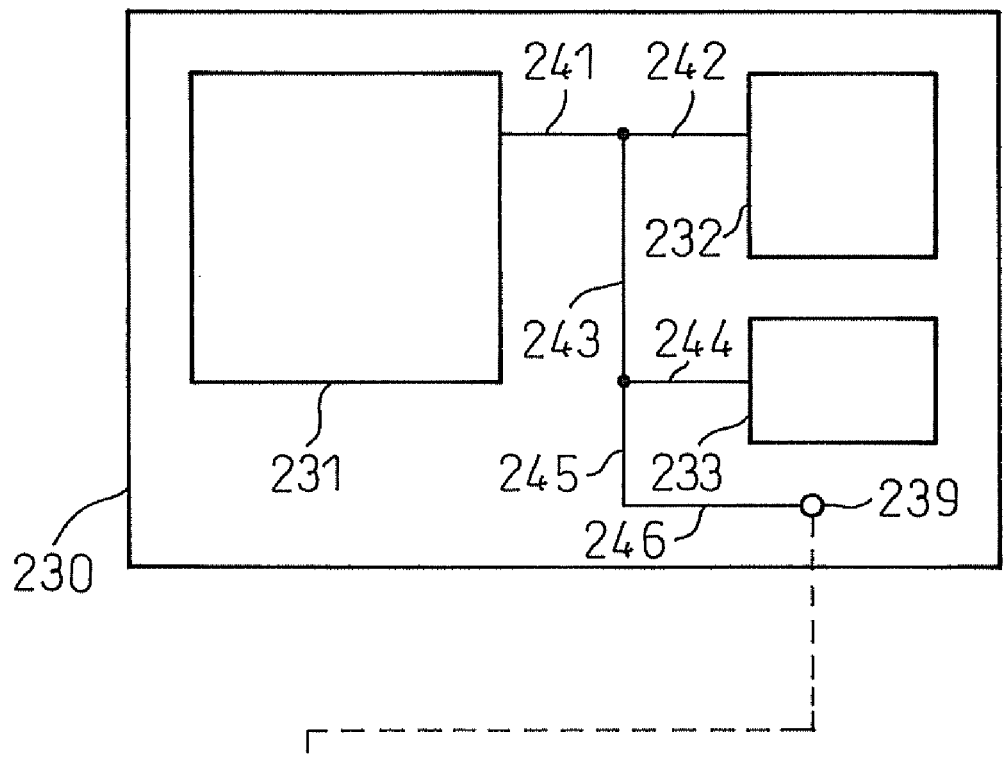
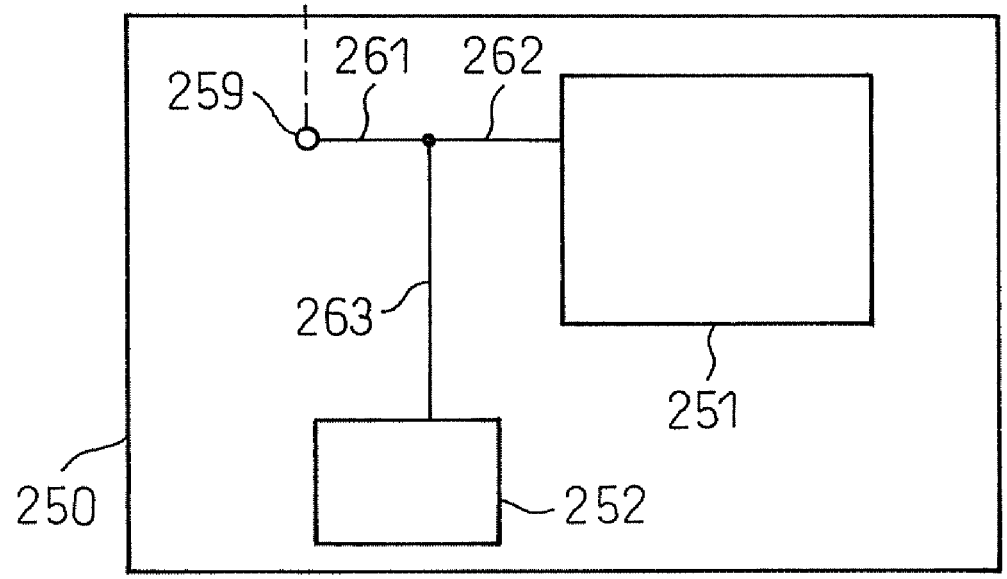

FIG.26A

| COMPONENT NAME △ | COMPONENT SPECIFICATIONS/ CIRCUIT SYMBOLS | TYPE | ADJUSTED COMPONENT TRACKING NO. | FAMILY COMPONENT |
|---|---|---|---|---|
| I 47 | TA46007-2380F1 | ELECTRICAL COMPONENT | | 0 |
| I 48 | TA46007-2380F1 | ELECTRICAL COMPONENT | | 0 |
| I 50 | TA46006-4367F1 | ELECTRICAL COMPONENT | | 0 |
| I 51 | TA46006-3514F1 | ELECTRICAL COMPONENT | | 0 |
| I 60 | TA46005-1010F2 | ELECTRICAL COMPONENT | | 0 |

FIG.26B

| NET NAME △ | NET NO. | VOLTAGE (V) | TYPE | SIGNAL LINE CLASSIFICATION | ADDITIONAL |
|---|---|---|---|---|---|
| AGCSELT2 | 346 | | GENERAL | NOT YET SET | |
| AGCSELT3 | 347 | | GENERAL | NOT YET SET | |
| AGCSELT4 | 348 | | GENERAL | NOT YET SET | |
| ALMEQPT | 497 | | GENERAL | NOT YET SET | |
| AMPCKR | 281 | | GENERAL | NOT YET SET | |

FIG. 27A

| DISPLAY NET INFORMATION | | | | | |
|---|---|---|---|---|---|
| FILE(F) EDIT(E) VIEW(V) | FILTER(L) | | | | |
| | SAME CONDITIONS AS SELECTED CELL(A) | | | | |
| NET NO. △ | SIGNAL NAME | VOLT | INSTRUCT CONDITIONS(D) | LINE CLASSIFICATION | ADDITIONAL INFORMATION 1 | ADDITIONAL |
| | | | DISPLAY ALL(R) | | | |
| 1 | BB | | | | NOT YET SET | |
| 2 | AA | | | | NOT YET SET | |

FIG.27B

INSTRUCT FILTER CONDITIONS

| PATTERN | CONDITIONS | AND/OR | PATTERN | CONDITIONS |
|---|---|---|---|---|
| ROM FUNCTION VERSION | EQUAL TO | AND | | EQUAL TO |
| LINE MARKER (LINE TYPE) | EQUAL TO ▶ | AND | | STARTING FROM |
| LINE MARKER (LINE WIDTH) | STARTING FROM ▶ | AND | | STARTING FROM |
| LINE MARKER (COLOR) | EQUAL TO ▶ | AND | | STARTING FROM |

BETWEEN ITEMS
⊙ AND  ○ OR

☐ ZOOM IF RESULT IS SINGLE CASE

CANCEL   CLOSE

CIRCUIT DIAGRAM DRAFTING SYSTEM AND METHOD AND COMPUTER PROGRAM PRODUCT

BACKGROUND OF THE INVENTION

1. Field of the Invention

The present invention relates to a circuit diagram drafting system and method and to a computer program product for the same, more particularly relates to a circuit diagram drafting system and method and a computer program for the same enabling easy confirmation of connections of the drafted circuit diagram.

2. Description of the Related Art

When electronic equipment is designed, the logic of the designed electronic equipment, that is, the connections among the components forming the electronic equipment, are expressed by a circuit diagram. In recent years, components of electronic equipment have been made smaller in size and have been arranged at a higher density. As a result, the drafted circuit diagrams have also become huge. The hardware or software for drafting circuit diagrams is provided with a design rule check function for verifying if there are any omissions in the connections of the drafted circuit diagrams or if there are any mistaken connections. However, in the end, a human operator has to check the connections by going through the circuit diagrams. To check circuit diagrams, the drafted drawings have been printed out on paper and the checked components or connections etc. have been colored by a marker pen etc. to verify that there are no errors or omissions in the circuit diagrams.

However, circuit design work almost never is completed at one go. Usually, the circuit design is reworked several times. Therefore, each time reworking the design, the work of verification of the circuit diagrams is necessary. The work of coloring the circuit diagrams by a marker pen is therefore performed each time the circuit diagrams are printed out. Therefore, there was the problem that an extremely large amount of time and labor were required for the above work.

The technology proposed up to now included one automatically extracting connection paths between circuit elements in a circuit diagram and highlighting the circuit elements and signal lines on the connection paths (see Japanese Patent Publication (A) No. 5-252286 and Japanese Patent Publication (A) No. 5-314200). However, since the techniques described in these publications perform processing for automatically extracting connection paths between the circuit elements, when the circuits checked were gigantic in size, there were problems in the efficiency, reliability, and flexibility of the verification work of the circuits.

SUMMARY OF THE INVENTION

The present invention was made to solve the above problems and has as its object the provision of a circuit diagram drafting system and method and computer program product enabling the circuit verification work to be efficiently and reliably performed in a manner corresponding to the circuit.

In one aspect of the present invention, to achieve the above object, there is provided a circuit diagram drafting system provided with a line marker managing unit for attaching a line marker on a connection based on a set unit selected from a predetermined plurality of line marker set units.

The set units may include at least a line unit forming connections, inter-terminal unit for designating connected terminals, and net unit.

Further, the circuit diagram may have, as a net unit, connections spanning a plurality of sheets through signal connection terminals connected to terminals of the circuit components. Further, the line marker set unit may include a connection unit limited to a single sheet.

Further, the system may be provided with a jump processing unit for starting processing displaying a terminal of another circuit component connected to a terminal or signal connector when the terminal of a circuit component or signal connector is selected.

In another aspect of the present invention, there is provided a circuit diagram drafting method for drafting a circuit diagram describing routes for connecting terminals of a plurality of circuit components, the circuit diagram drafting method having a step of selecting a desired set unit from a predetermined plurality of line marker set units and a step of attaching a line marker on a route by the selected set unit.

In still another aspect of the present invention, there is provided a computer program for realizing in a computer a function of processing selection of a set unit of a line marker by an operator to determine a set unit and a function of processing selection of part of the connections by an operator and attaching a line marker by the determined set unit on the connections.

The present invention, being configured in the above way, can select a set unit of a line marker and attach a line marker corresponding to the characteristics of the circuit prepared. Further, even if a circuit design is reworked, since the verified connections have line markers attached, the time and labor involved in verification work can be reduced. Further, since the connected terminals can be jumped to in the display, the verification work at the time of attaching a line marker becomes easy.

BRIEF DESCRIPTION OF THE DRAWINGS

These and other objects and features of the present invention will become clearer from the following description of the preferred embodiments given with reference to the attached drawings, wherein:

FIG. 8 is a view showing a search bar on which signal connector information is set;

FIG. 13A is a view showing a tool bar for setting attributes of a line marker, while

FIG. 14 is a view for explaining a set unit of a line marker;

FIG. 26A is a view explaining that the existence of line markers can be confirmed in a display of a list of component information, while FIG. 26B is a view explaining that the existence of line markers can be confirmed in a display of a list of net information;

FIGS. 27A and 27B are views for explaining a narrowed search operation by line markers in the display of a list of net information;

BEST MODE FOR WORKING THE INVENTION

Figure 1:
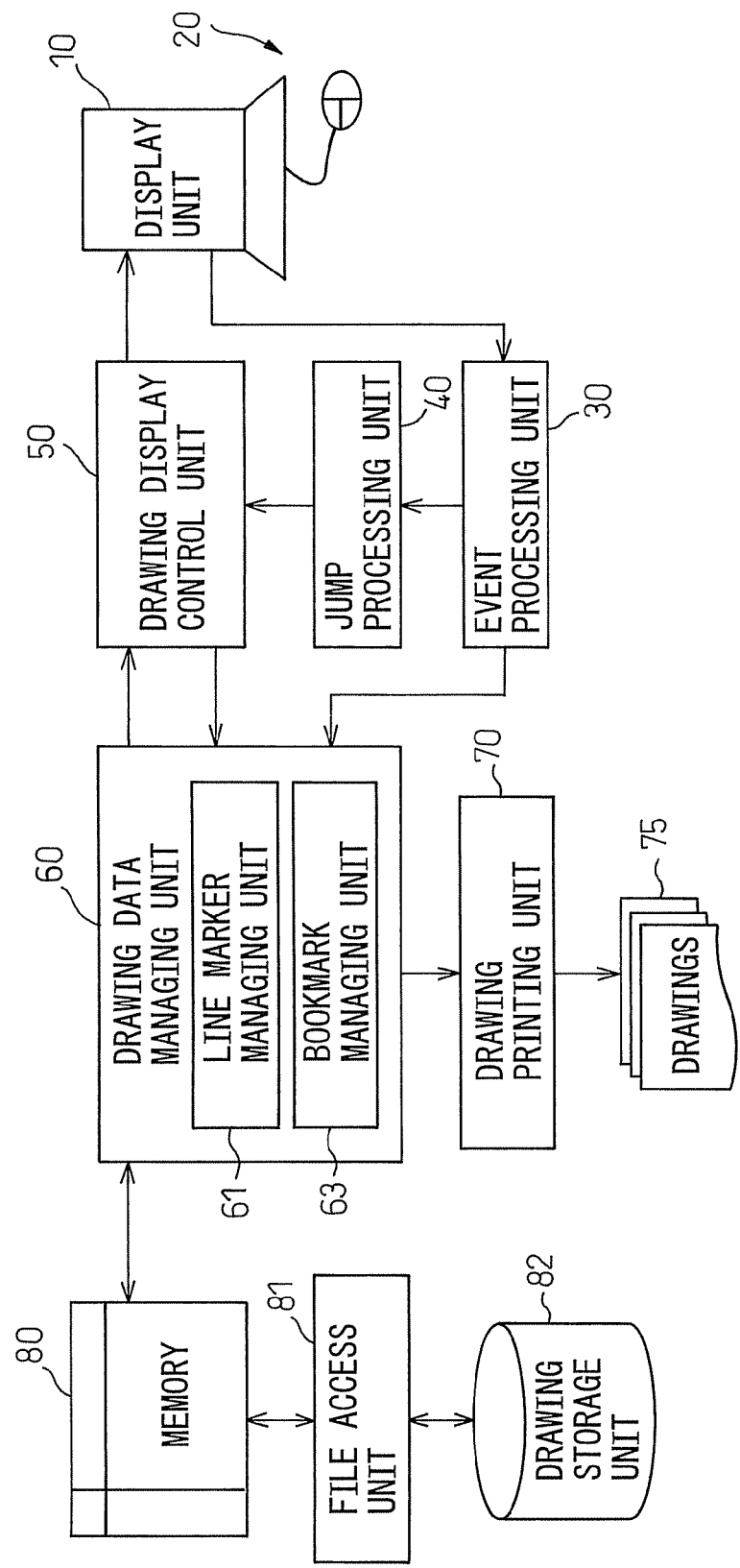
FIG. 1 is a view of the system configuration of a circuit diagram drafting system of the present embodiment.

Below, embodiments of the present invention will be explained with reference to the drawings. FIG. 1 shows the system configuration for line marker processing or bookmark processing of a circuit diagram drafting system according to one embodiment of the present invention. The operator uses a keyboard or mouse or other input device 20 while referring to a display unit, that is, a screen 10, to draft a circuit diagram. This is stored through a file access unit 81 in a hard disk or other drawing storage unit 82 as a drawing file.

When the drafted drawing data is to be verified, the drawing file storing the drawing data is taken out from the drawing storage unit 82 through the file access unit 81 and the drawing data is loaded in the memory. That drawing data is sent through a drawing data managing unit 60 for attaching and managing line markers, bookmarks, etc. to a drawing display control unit 50 and displayed on the display unit 10.

In the present embodiment, when verifying the circuit diagram displayed on the display unit 10 using that display unit, a verified circuit component or route has a line marker attached to it. For this, provision is made of an event processing unit 30 for obtaining and processing an event occurring in the circuit diagram drafting system and a jump processing unit 40 for processing for jumping from a sheet on which a certain component is shown to a sheet on which a component forming a connection destination of that component is shown so as to enable a route or line marker between components positioned at a plurality of sheets to be referred to by input from the event processing unit 30. Further, the drawing data managing unit 60 is provided with a line marker managing unit 61 for attaching a line marker on a drawing, deleting it, etc. by input from the event processing unit 30 and managing information regarding the line marker and a bookmark managing unit 63 for inserting into the circuit diagram and managing a bookmark for a subsequent search by input from the event processing unit 30. The line marker and bookmark information is stored in the drawing storage unit 82. Further, the line markers and bookmarks can be printed by a drawing printing unit 70 on the drawing 75. Below, the operations of the characteristic features of the present embodiment, that is, the jump processing unit 40, line marker managing unit 61, and bookmark managing unit 63, will be explained in detail.

Figure 2:
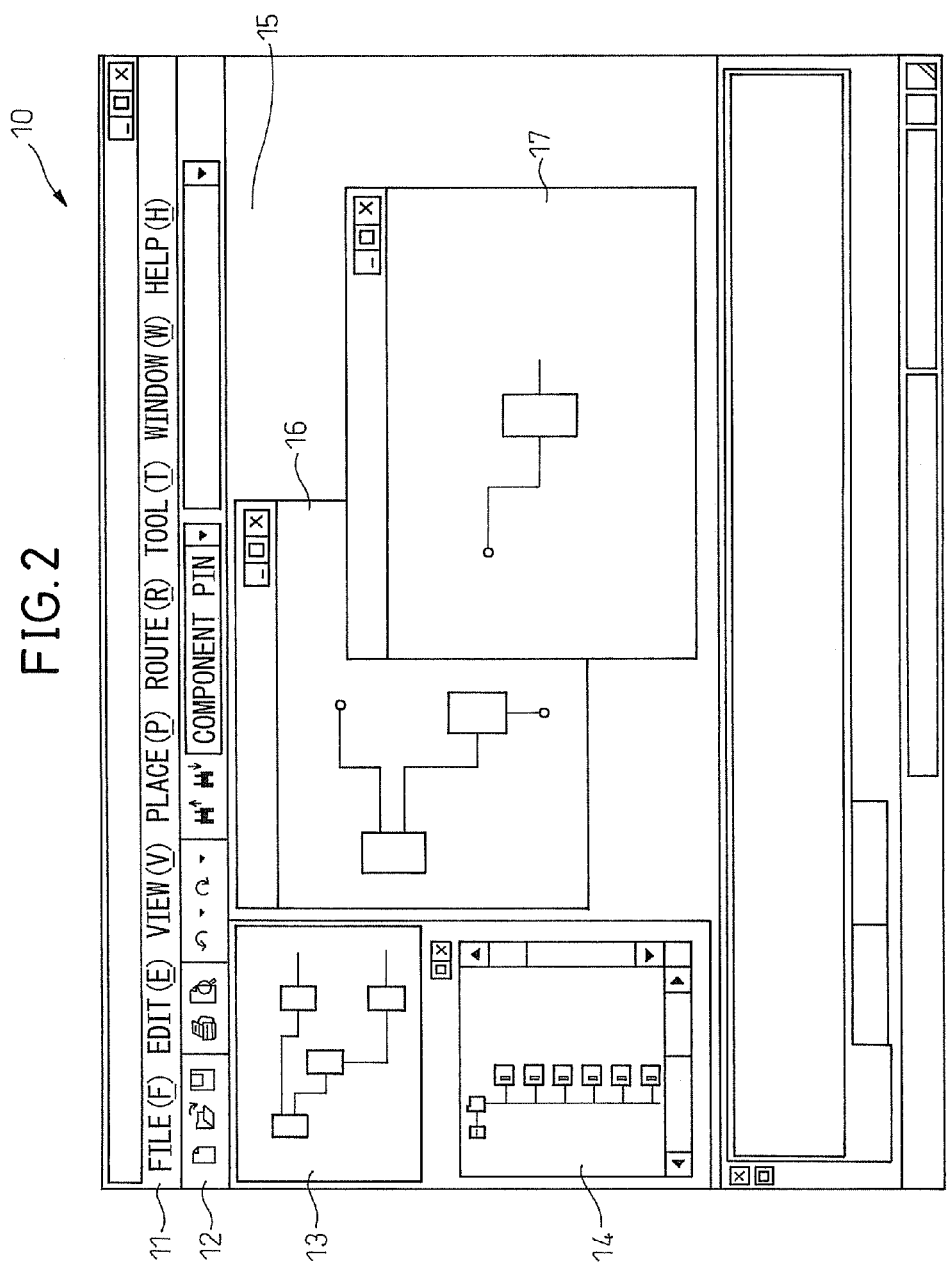
FIG. 2 is a view of an example of the screen of a circuit diagram drafting system of the present embodiment.

FIG. 2 is an example of a screen displayed on a display unit 10 of a circuit diagram drafting system according to the present embodiment. The display unit 10 displays a plurality of windows used for the circuit verification work. A full view window 13 is the window for displaying the circuit diagram as a whole. A sheet tree window 14 displays the drawings forming the circuit diagram as a whole, that is, the individual sheets, in a tree form. A sheet selected at the sheet tree window 14 is displayed on a sheet window 15 for displaying a sheet. FIG. 2 shows an example where two sheets (16, 17) are selected and displayed. The top of the screen is provided with a menu bar 11 showing items which can be executed in the currently opened window and a tool bar 12 where operations frequently used in the menu are displayed as icons.

Figure 3A:
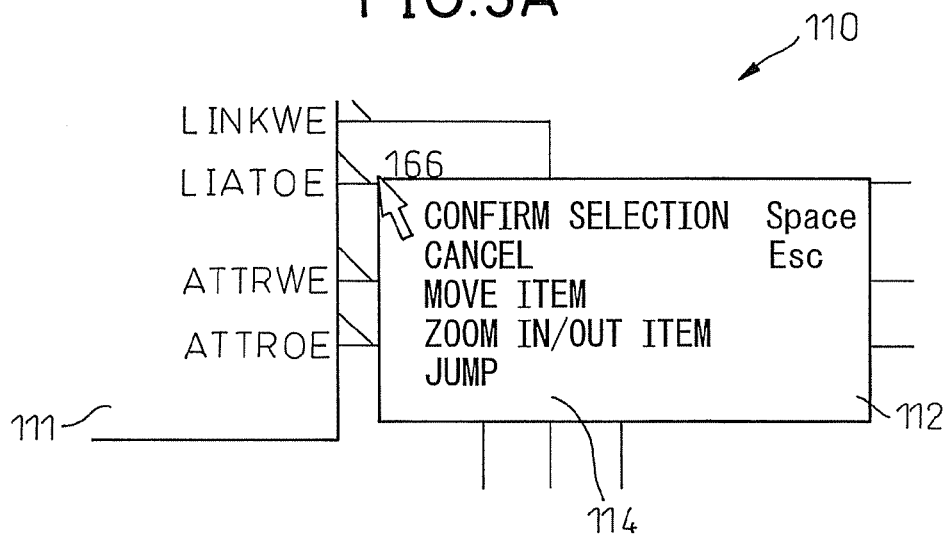
FIGS. 3A to 3C are views for explaining the operation of displaying a plurality of connection destinations of a component pin, selecting one connection destination from among them, and displaying a sheet of the selected connection destination.
Figure 3B:
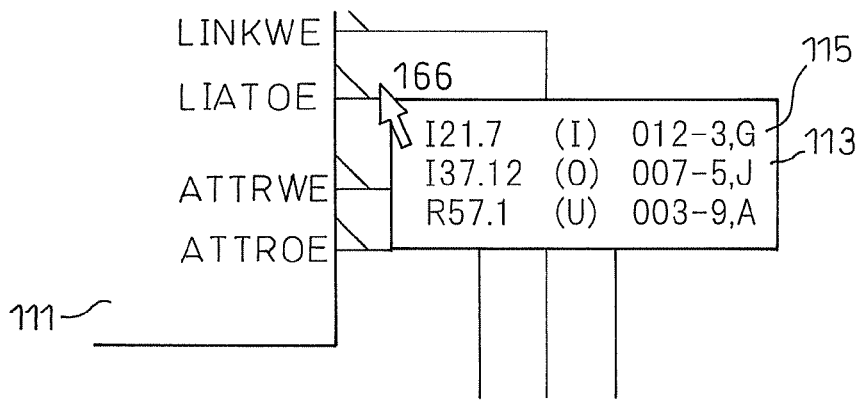

Next, referring to FIGS. 3A to 3C, the processing by the jump processing unit 40 for checking a circuit diagram on the screen of the circuit diagram drafting system will be explained. FIGS. 3A and 3B show part of a single sheet 110 displayed on the sheet window 15 including a circuit component 111. FIGS. 3A and 3B show the part of the circuit component 111 provided with terminals (pins) in an enlarged manner. Lines are connected to pins of the circuit component. When confirming to which component of another sheet the line connected to the pin 166 of the component 111 is connected to, the operator moves the cursor over the position of the pin of the component to which the line whose connection destination is desired to be confirmed is connected on that sheet and the right button of the mouse is clicked. Due to this right click, a popup menu 112 is displayed on the screen enabling selection of item movement, item zoom in/out, or other items and also a jump item 114 enabling display of connection destinations of the selected pin. If selecting a pin to which no line is connected, the jump item of the popup menu cannot be selected.

Next, if selecting the jump item 114 from the popup menu, a list 113 of component pins theoretically connected to the line such as shown in FIG. 3B is displayed. The component pin list displays the following:

Component name. Component pin name (component pin type)

Sheet name—x-coordinate, y-coordinate

Taking as an example the first item 115 of the component pin list 113, the component name is I21, the component pin name is 7, the component pin type is "I", the sheet name is 012, the x-coordinate is 3, and the y-coordinate is G. Here, component pin types include I: input (In), O: output (Out), C: input/output (InOut), N: not connected (NC), P: power, G: ground, U: Undefined, etc. Further, the "sheet name, x-coordinate-y-coordinate" can optionally be displayed as "sheet name x-coordinate y-coordinate". In the above example, "012-3, G" can optionally be displayed as "0123G". In the present embodiment, a sheet is divided along the x-axis and y-axis into a plurality of blocks. The coordinates show the blocks on the sheet. Therefore, it is learned that one of the pins to which the pin 166 is connected is the pin 7 of the component I21, the component pin 7 is an input pin, and, further, the component I21 is shown in the block (3, G) of the sheet 012.

Figure 3C:
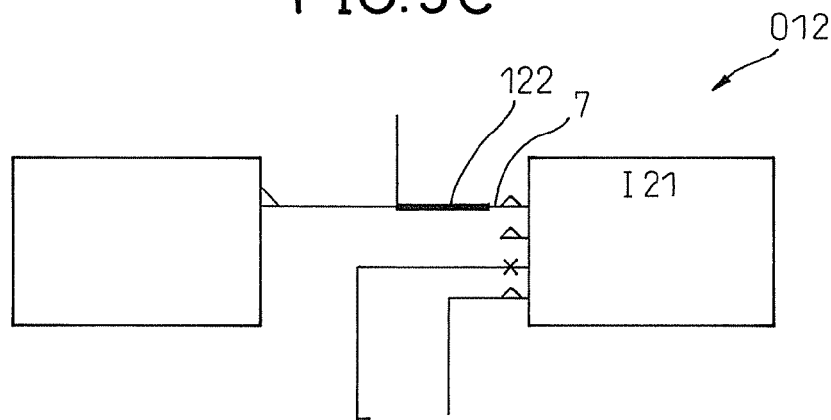

As shown in FIG. 3B, in the state where the component pin list 113 showing the components and pins connected to the pin 166 displays a plurality of component pins, if selecting the item 115 showing the component I21, as shown in FIG. 3C, processing is performed to display the sheet 012 where the component I21 of the selected item 115 is present on the sheet window. A component on the component pin list is selected by moving the cursor over the position of the desired component then clicking the left side button of the mouse. To display the component pin 7 of the component I21 connected to the pin 166 in an easily understandable manner, the pin 7 of the component I21 is displayed at the center of the sheet 021.

Note that when, instead of clicking on the left button of the mouse to select an item on the component pin list 113 shown in FIG. 3B, moving the cursor over an item of the component pin list 113 and clicking the right button to select it, the content of the sheet of the selected item is displayed temporarily by a full view. For example, if right selecting the item 115 in the pin list 113 shown in FIG. 3B, while selecting it, a full view of the sheet 012 is displayed on the full view window 13. By displaying a full view of the sheet, it is possible to confirm the state of the circuit diagram to be jumped to and improve the operation efficiency.

FIG. 3C shows an example of display of a sheet including the component pin forming the connection destination of the component 111 shown on the original sheet 110. When displaying the sheet of the connection destination, the line connected to the component pin of the selected component (in the example of FIG. 3C, the component I21) is highlighted so as to facilitate discrimination between the connection line corresponding to the component pin of the selected component and the lines connected to component pins which are not selected. In FIG. 3C, the line 122 connected to the component pin 7 of the component I21 is highlighted. This highlighting for example comprises display by a highlighting color such as a red color.

Figure 4:
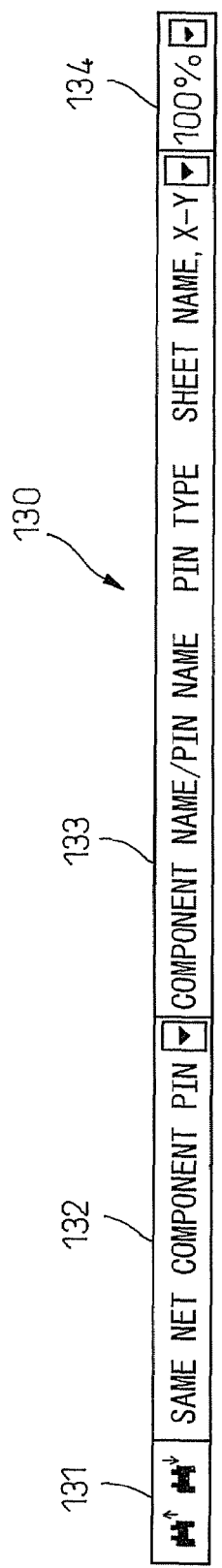
FIG. 4 is a view showing a search bar in which component pin information is set.

FIG. 4 shows an example of a search tool bar 130 of the present embodiment. The search tool bar 130 is provided with icons 131 used for a forward search and a backward search plus a classification box 132 showing a classification of the component, a signal name box 133 displaying a list of component pin information displayed by a jump function, and a zoom box 134 showing a zoom rate. The component pin information displayed by the jump function is set in the search tool bar. The forward search or backward search use search icon 131 of the search tool bar may be used for a search. In this way, it is possible to use a search icon 131 to successively display component pins connected to the selected component.

Note that even if a line is connected to a pin of a component, when there is no connection destination, that is, in the case of a so-called "antenna net", even if selecting "jump" from the popup menu, no component pin list is displayed, the message "The line connected to the "designated component pin (component name.pin name) is an antenna net. There is no connection destination" is output, and the processing is ended.

Figure 5:
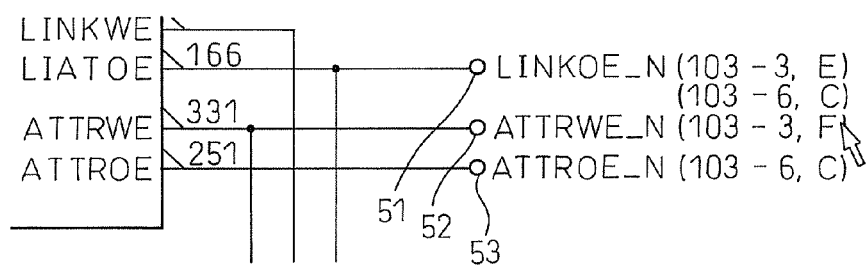
FIG. 5 is a view showing cross references displayed on signal connectors.
Figure 6:
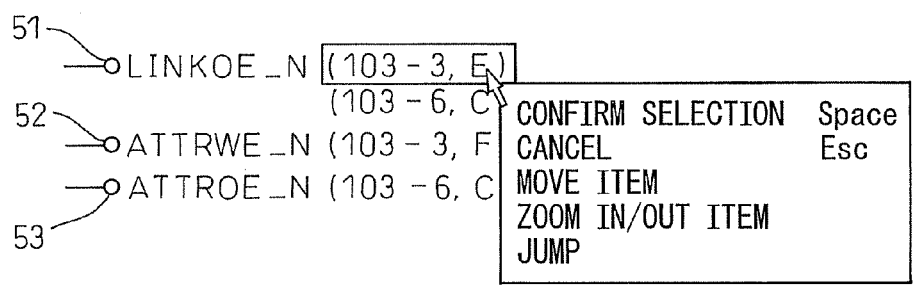
FIG. 6 is a view showing a state where one cross reference is selected among a plurality of cross references displayed at signal connection terminals.

FIG. 5 is a view of the state of a component shown in FIG. 3 and the signal connectors connected to the component. FIG. 6 shows an example where the signal connectors 51 to 53 of the lines connected to the component pins 166, 231, and 251 of a component positioned on the sheet displayed on the screen have corresponding signal names and cross references described. The signal connectors 51 to 53 are symbols showing that the lines are connected to components on other sheets. The cross references show the sheet nos. and coordinates of the corresponding connection destinations of the signal connectors. For example, in the signal connector 51, the other side connected to through the signal connector 51 is shown by the signal name "LINKOE_N" and the cross reference "(103-3, E), (103-6, C)". The signal connector 51 has two cross references, so it is shown that there are two other sides connected to. The cross reference of the signal connector 51 shows the sheet no. (103) and the coordinates (3, E). The signal connectors 52 and 53 respectively have single cross references. If there is just a single cross reference for a signal connector, it is possible to double click the position of that cross reference on the screen so as to have processing executed for displaying the corresponding sheet. For example, by double clicking on the cross reference of the signal connector 52, it is possible to display the sheet 103 enlarged centered about the coordinates (3, F).

When a plurality of cross references for a signal connector are displayed on the screen, by double clicking on one among them, that is, the cross reference (103-3, E), it is possible to select the corresponding cross reference. Due to this, a popup menu for selection of processing relating to the cross reference is displayed on the screen. In FIG. 6, the selected cross reference is displayed by bold lines, but it may also be displayed by a selection color such as the red color. Next, if selecting the jump item on the displayed popup menu, it is possible to display the sheet 103 of the connection destination to be connected to the signal connector 51 enlarged centered around the coordinates (3, E). Note that in FIG. 6, the example is shown of display of two cross references, but naturally three or more cross references can be displayed and one selected from among them.

Figure 7A:
FIGS. 7A and 7B are views for explaining the operation for displaying a list of cross references at a signal connector where no cross reference is displayed.
Figure 7B:

If there is no space on the screen for displaying the cross references or if displaying the cross references would obstruct understanding, it is also possible to perform processing for not displaying the cross references. In this case, by selecting on the screen a signal name displayed on the screen in the form as shown in FIG. 5, the screen displays the popup menu shown in FIG. 7A. Next, if selecting the jump item in the popup menu displayed on the screen, a cross reference list shown in FIG. 7B is displayed on the screen, so by selecting a cross reference corresponding to the desired sheet from the cross reference list, the desired sheet can be displayed. In the example of FIG. 7B, the cross reference (032-2, F) is selected, so the sheet 032 enlarged about the coordinates (2, F) can be displayed.

Note that the display format (032-2, F) of the cross reference list can, in the same way as the component pin list, be made (sheet name x-coordinate y-coordinate) like (0322F).

Further, when selecting an item on the cross reference list shown in FIG. 7B, if using the right button to select a cross reference, the content of the sheet of the selection item is temporarily displayed in a full view window. Whether the selection of the cross reference was suitable or whether the desired sheet can be displayed can be checked beforehand.

In the same way as a component pin, the information of the signal connector displayed on the sheet using the jump function is set and stored at the search tool bar 130 in the present embodiment. FIG. 8 is a view showing an example of a tool bar at which signal connector information is set. The classification name in the classification box 132 corresponding to the signal connector having the connection destination sheet displayed is a "signal connector". Due to this, it is possible to successively display components, pins, etc. connected to a signal connector using the forward search or backward search use search buttons 131.

Next, referring to FIGS. 9A and 9B, the pass over of two-terminal components will be explained. In the present embodiment, it is possible to set pass over of inductors, capacitors, resistors, and other two-terminal components. By setting this in advance, the two-terminal components are not displayed on the component pin list and are excluded from jump destinations. This is because two-terminal components have only one input and one output, so a check can be omitted in some cases.

Figure 9A:
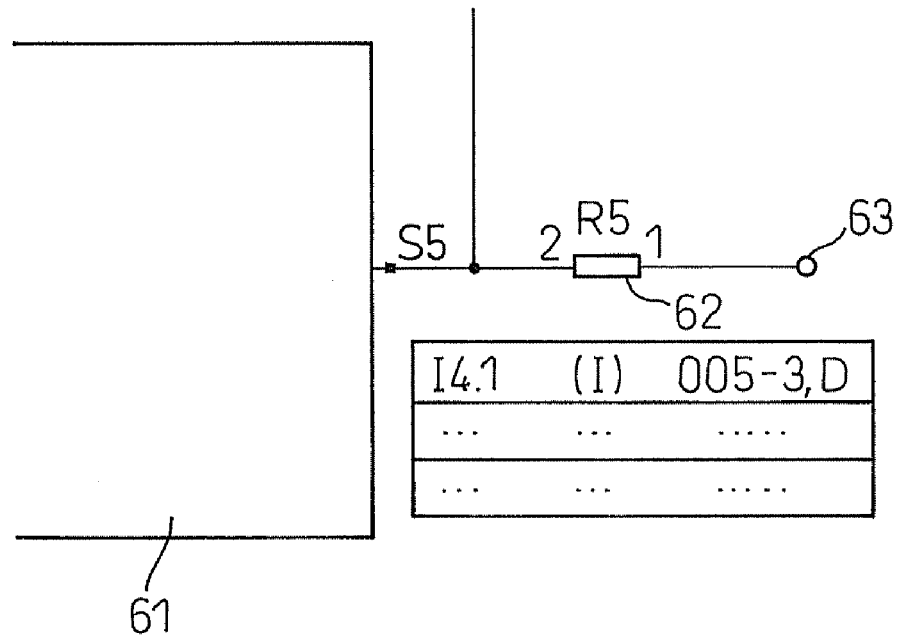
FIGS. 9A and 9B are views for explaining a logical pass over of a two-terminal component.
Figure 9B:
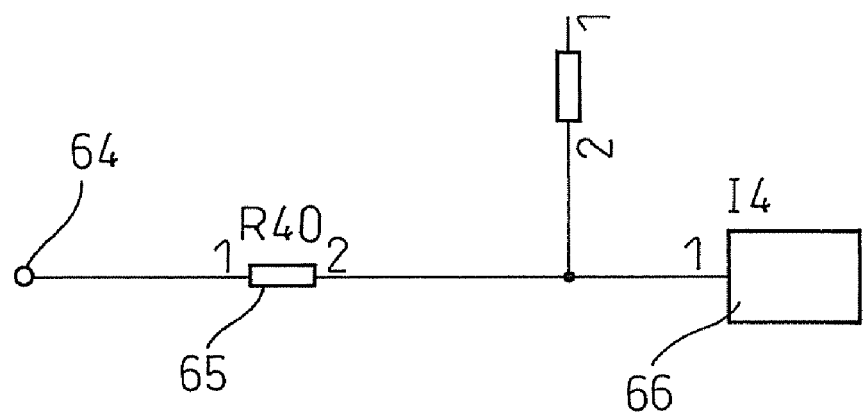

FIGS. 9A and 9B show examples of lines connected through connection terminals described on different sheets when setting pass over of two-terminal components. In FIG. 9A, the terminal S5 of the component 61 is connected through the resistor 62 to the signal connector 63. In FIG. 9B, the signal connector 64 connected to the signal connector 63 is connected through the resistor 65 to the component 66.

In FIG. 9A, since pass over of two-terminal components is set, if selecting the signal pin S5 of the component 61 and displaying the component pin list of the connection destinations, one among them, that is, the component 66 (I4.1) is shown as the connection destination. When otherwise not setting pass over of two-terminal components, the resistor 62 (R5.2) would be displayed as a connection destination, but here the resistor 62 is not displayed as a connection destination. Further, the further along resistor 65 is also not displayed.

In the present embodiment, a bookmark managing unit 63 (FIG. 1) enables a bookmark to be added on a drawing when drafting or checking a drawing. By searching for the bookmark, it is possible to display the sheet or part of the sheet where the bookmark was added. A bookmark can be added to a component and component pin and further can be added to any blank part on the drawing. A bookmark may have any name, that is, keyword, appended to it and may have a comment described in it.

Figure 10A:
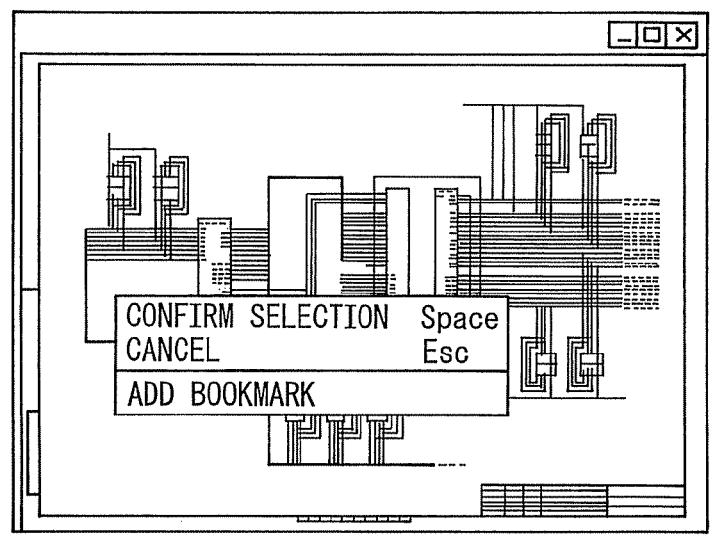
FIGS. 10A to 10C are views for explaining an operation for creating a bookmark.
Figure 10B:
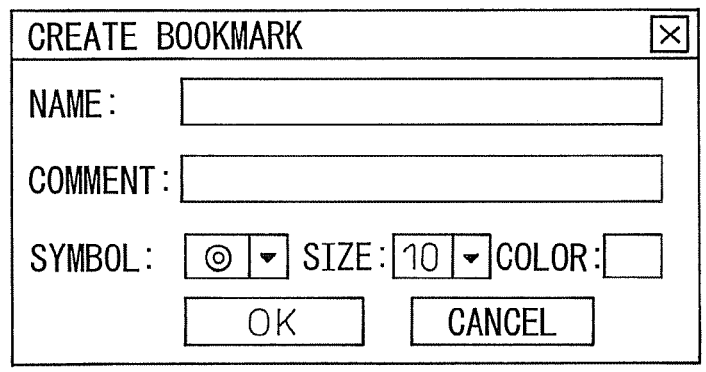
Figure 10C:
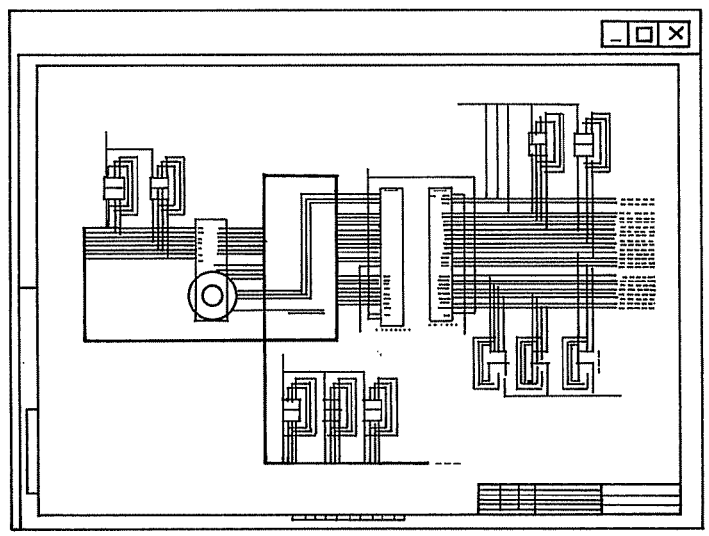

FIGS. 10A to 10C show the method of adding a bookmark. To attach or add a bookmark, a component, component pin or other location on the sheet where the bookmark is desired to be added is selected. Due to this, a popup menu is displayed for processing for setting or adding a bookmark as illustrated in FIG. 10A. When canceling the processing for adding a bookmark, "cancel" set on the popup menu is selected.

If selecting "add bookmark" from the popup menu shown in FIG. 10A, a dialog for creating a bookmark shown in FIG. 10B appears. When setting a name for a bookmark, the name to be set is entered into the name field of the dialog box shown in FIG. 10B. Further, when it is necessary to set a comment for a bookmark, a comment is entered into the dialog box for a comment. In this dialog, the "sheet name (coordinates)" can also be set as the default for the name of the bookmark. The bookmark is displayed on the sheet by the designated symbol, size (font size), and color. In the present embodiment, the symbol showing a bookmark is the bull's eye of a size of 10 points. If entering a predetermined item by the dialog shown in FIG. 10B and pressing the OK button, as shown in FIG. 10C, the sheet displays a bookmark by the bull's eye symbol at the desired location. When giving a component or component pin a bookmark, when moving the component or component pin, the bookmark moves along the sheet following the moved component or component pin.

In the dialog shown in FIG. 10B, a dialog box is set for selecting the symbol showing a bookmark. In the example of FIG. 10C, the symbol showing a bookmark is a bull's eye, but in the dialog box, a circle, bull's eye, cross, square, black diamond, triangle, inverted triangle, or the like can be selected from the drop down list. Further, as the symbol, it is also possible to directly add any symbol (single character) to the symbol selection box for use. The size of the symbol can be designated by points. It is possible to select the points 8, 9, 10, 11, 12, 14, 16, 18, 20, 22, 24, 26, or 28 from the drop down list. The color of the symbol can be selected by selecting the field labeled "color" in the dialog box, displaying a color palette, and setting any color from there.

Figure 11:
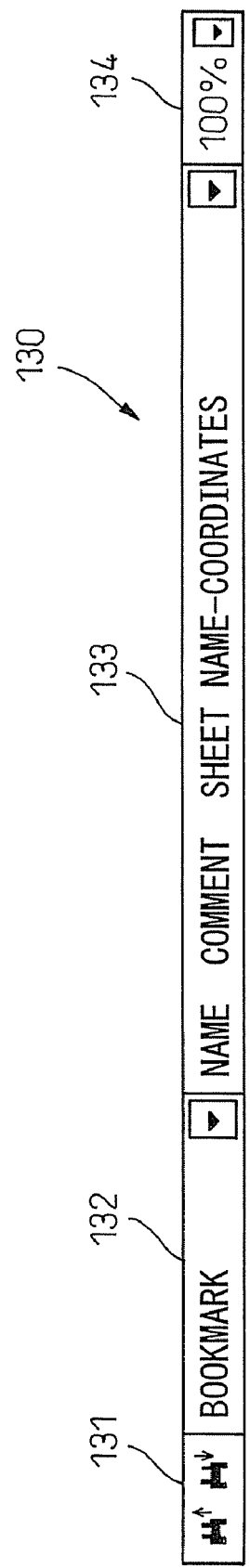
FIG. 11 is a view showing a search bar on which a bookmark is set.

The bookmark created by the operation explained in FIGS. 10A to 10C is set and stored in the search tool bar 130 shown in FIG. 11. That is, the classification box 132 displays the bookmark, while the signal name box 133 displays the bookmark name, comment, etc. These are displayed as drop down lists. When a bookmark is selected from a drop down list, the sheet where the selected bookmark is positioned is displayed on the screen.

Figure 12:
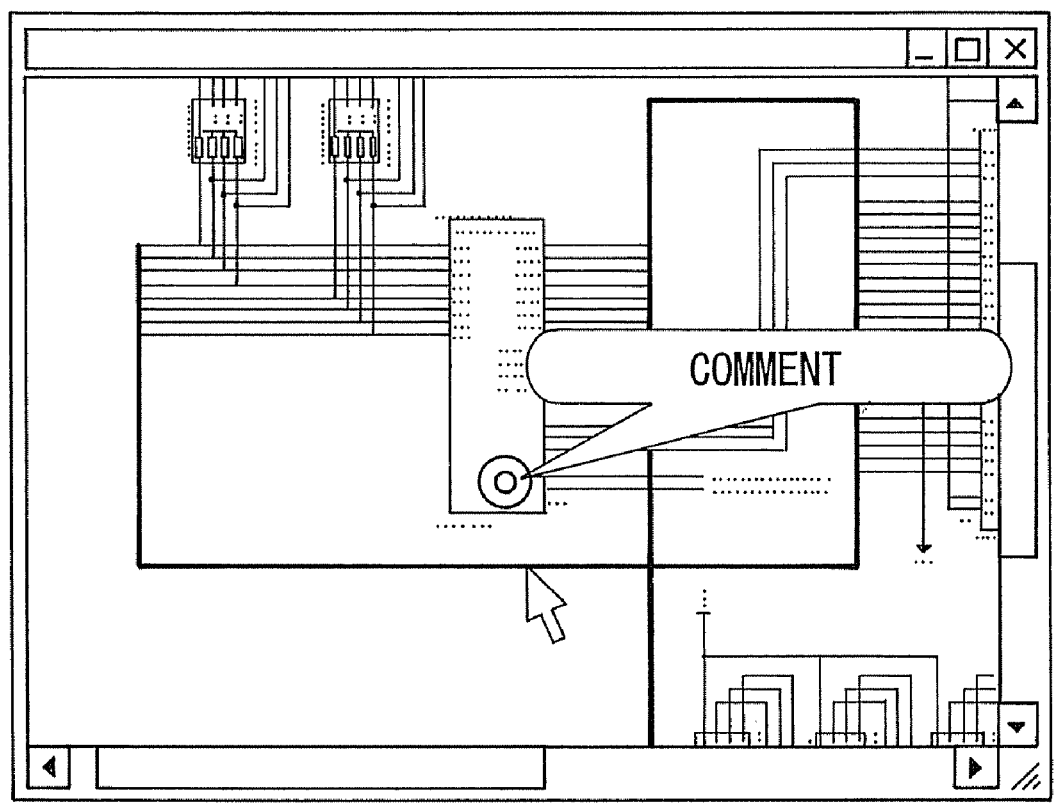
FIG. 12 is a view showing a comment of a bookmark in a balloon form.

The sheet displayed using the search tool bar 130 shown in FIG. 11 is displayed by a designated zoom rate centered around that bookmark. FIG. 12 shows the sheet on which the book is set displayed on the screen. If using the forward search or backward search use search button 131 on the search tool bar shown in FIG. 11, the bookmarks can be successively selected and the sheets set with the selected bookmarks can be successively displayed corresponding to the selection of the bookmarks. Further, if moving the cursor over a bookmark displayed on the sheet, a set comment is displayed in a balloon.

Bookmarks can be copied and moved by themselves independently from the components, component pins, and sheets to which they are attached. The names of the bookmarks when being copied may be made the same names or given suffixes. This may be selected as an option. When giving suffixes, for example, it is possible to set the bookmark name plus the number symbol and a number such as "abc#1" or "abc#2". When deleting a bookmark, it is possible to select the bookmark desired to be deleted and delete it. As an option, it is possible to copy or move bookmarks linked with the bookmarked elements such as components, component pins, or sheets.

Whether or not to display bookmarks on the drawings may be selected as an option. At the time of printing as well, it is possible to select whether or not to print the bookmarks as a print option. In the present embodiment, as a default, the bookmarks are set not to be printed.

Next, the attachment of a line marker by the line marker managing unit 61 to a line or bus line on a circuit diagram will be explained.

Figure 13A:
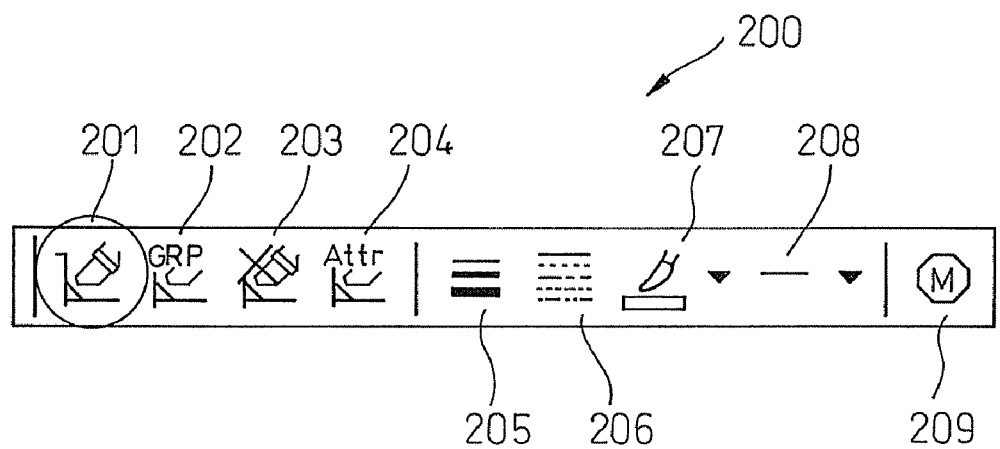
Figure 13B:
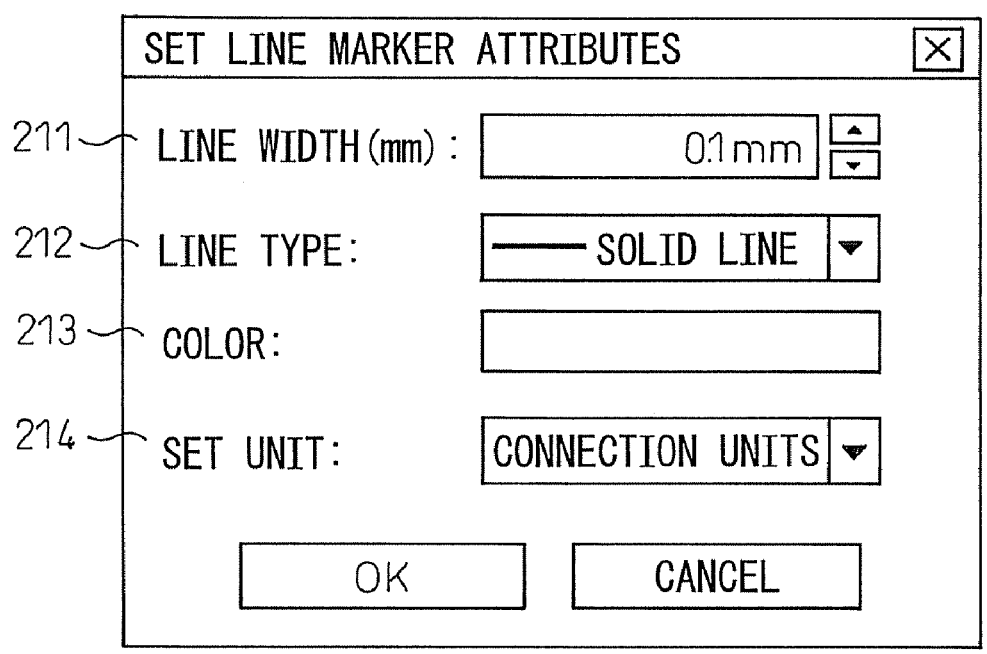
FIG. 13B is a view showing a line marker attribute setting dialog.

To set a line marker, first, "edit"-"line marker"-"set" is selected from the edit item of the menu bar. FIG. 13A shows an example of a line marker tool bar. In the case where the line marker tool bar 200 shown in FIG. 13A is displayed on the screen, by selecting the setting icon 201, the line marker attribute setting dialog of FIG. 13B is displayed. Note that the line marker tool bar 200 is provided with, in addition to the setting icon 201, a collective setting icon 202 for collectively setting line markers for all elements having a specific attribute, a delete icon 203 for changing to the delete mode of a line marker, and an attribute change icon 204 for changing the attributes of a line marker. Further, buttons for setting the line width 205, line type 206, color 209, and set unit 208 are displayed on the line marker tool bar 200. The icon buttons displayed on the line marker tool bar 200 can be changed in settings. Note that the icon 209 is for reset use. By this, it is possible to collectively delete manually set line markers.

In the line marker attribute setting dialog illustrated in FIG. 13B, the line width, line type, color, set unit, etc. of a line marker can be set. In the present embodiment, the line width of the line marker can be set by the line width setting box 211 to a range of 0.1 mm to 4.0 mm. Further, the line type can be set by the line type setting box 212 to a solid line, dotted line, one-dot chain line, two-dot chain line, or broken line. The line marker color can be set by the color setting box. Here, the color is set by selecting the color setting box 213 and displaying the color setting dialog. Further, as the unit for setting a line marker, in the set unit setting box 214, a line member, connection unit, net name unit, between pins, or component may be selected. The attributes of the line marker changed by this dialog are reflected in the line width 205, line type 206, color 209, and set unit 208 of the line marker tool bar 200.

FIG. 14 is a view for explaining the set unit of a line marker. The first sheet 230 has the components 231, 232, and 233 arranged on it. The components 231, 232, and 233 on the first sheet 230 are connected with each other by the lines 241, 242, 243, and 244 and further are connected through the lines 245 and 246 to the signal connector 239. The second sheet 250 has the components 251 and 252 connected to the signal connector 259 arranged on it. The components 251 and 252 are connected through the lines 262 and 263. Further, they are connected through the line 261 to the signal connector 259. Further, the signal connector 239 provided at the first sheet 230 is connected to the signal connector 259 provided at the second sheet 250.

When the set unit is a line member, segments, that is, lines, connecting nodes of connection pins and lines and nodes of lines become the set units. The set units can be given line markers. For example, if setting line markers at line members on the first sheet 230, the lines 241, 242, 243, 244, 245, and 246 can be selected and the individual lines given line markers. On the second sheet 250, the lines 261, 262, and 263 can be given line markers.

When the set unit is a connection unit, it is possible to give the line marker to all of the lines connected to a component or signal connector on a single sheet. At the first sheet 230, if setting the line marker at a connection unit, for example if selecting the line member 243 and setting a line marker there, the line marker is given all together to the lines 241, 242, 243, 244, 245, and 246 connected to that line 243 on the sheet. Further, on the second sheet 250, if for example selecting the line 261 and setting a line marker there, the line marker is given to the lines connected to the line 261, that is, the lines 261, 262, and 263.

When the set unit is a net unit, when selecting one line, it is possible to set the line marker not only at lines positioned on a sheet, but also lines positioned on other sheets connected to by signal connectors. When the set unit is set as a connection unit, the attached line marker is limited to a single sheet, but if set as a net unit, the line marker is given to lines connected by signal connectors even on different sheets.

That is, when set as a net unit, if selecting the line 243 on the first sheet 230 and setting a line marker there, the lines connected to the line 243, that is, the lines 241, 242, 243, 244, 245, and 246 are set with the line marker and the lines 261, 262, and 263 on the second sheet 250 connected through the signal connectors 239 and 259 are given the line marker.

When the line marker setting dialog of FIG. 13B is displayed, if the already set attributes are good enough, it is possible to leave this dialog as displayed and select a line for display of a line marker. When pushing the OK button, the line marker setting dialog is closed and the element selection mode is entered.

Figure 15:
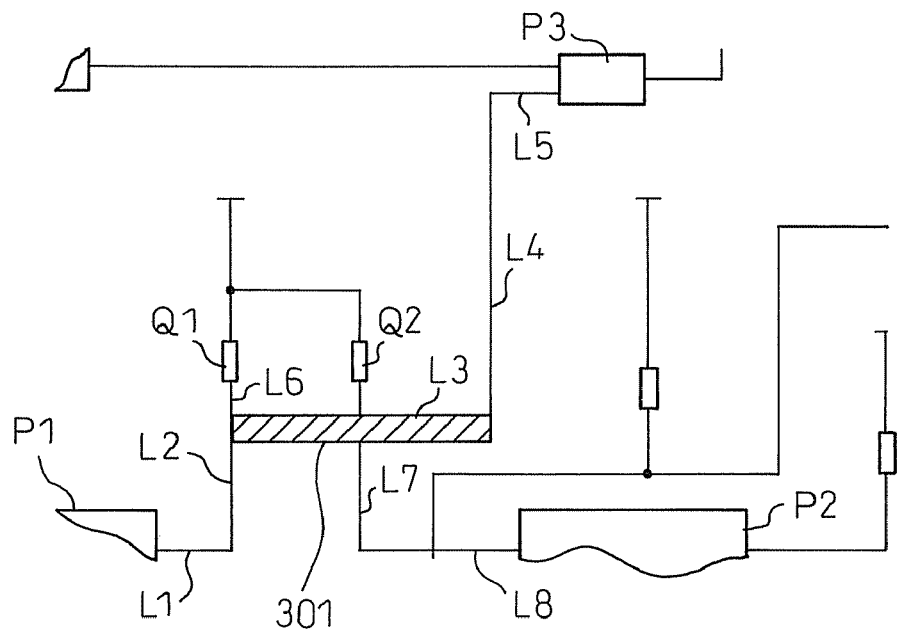
FIG. 15 is a view showing an example of attaching a line markers when the set unit of the line marker is a line unit.

In the element selection mode, by selecting an element to which a line marker is desired to be attached, as explained with reference to FIG. 14, it is possible to set a line marker for each set unit. FIG. 15 is a view of one mode of sheet display in the case where the set unit is a line member and a line marker is set for lines. FIG. 15 shows connections of the components P1, P2, P3, Q1, and Q2 as the lines L1 to L8. When the set unit is a line member, if selecting a line desired to be given a marker, for example, the line L3, as shown in FIG. 15, it is possible to attach the line marker 301. In FIG. 15, the hatching shows the line marker, but as explained above, the line marker can be a designated line width, line type, or color.

Figure 16:
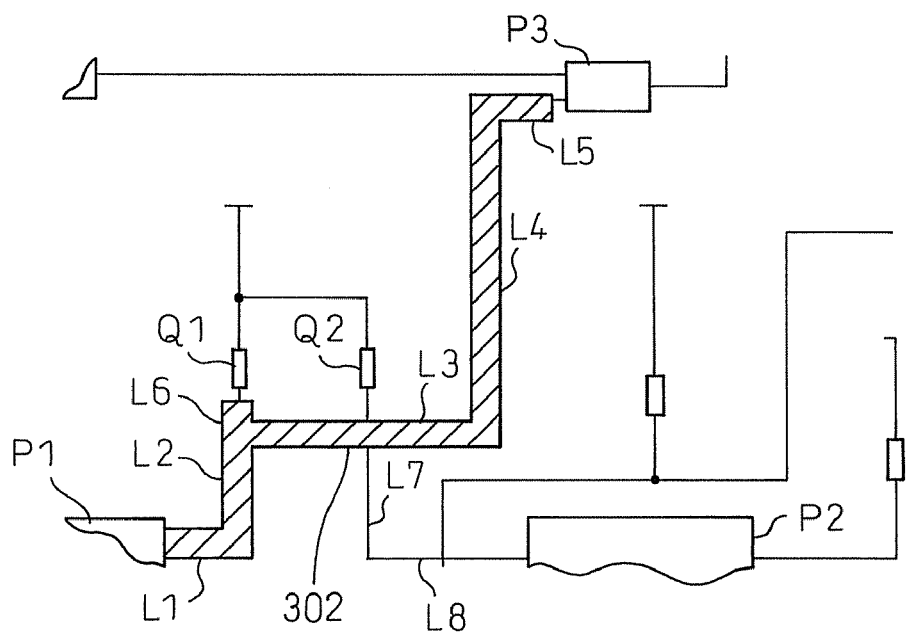
FIG. 16 is a view showing an example of attaching a line marker when the set unit of the line marker is a connection unit.

When the set unit is a connection unit, if selecting any line from the lines connected from one component pin to another component pin, all of the lines between those component pins can be given the line marker. FIG. 16 shows the state when setting a line marker 302 in the case where the set unit is a connection unit. If selecting the line L3 in the same way as in FIG. 15, since, in FIG. 16, the set unit is a connection unit, the line marker 302 is set between the component pins of the components P1, P2, and P3 to which the line L3 is connected. Specifically, the line marker 302 is set on the lines L1, L2, L3, L4, L5, and L6. The line marker 302 is set not only when selecting the line L3. It is also possible to attach the line marker 302 no matter which of the lines L1, L2, L4, L5, and L6 is selected. When the set unit is a net name unit, it is also possible to set a line marker collectively even on lines to components connected by signal connectors but positioned on other sheets.

Figure 17A:
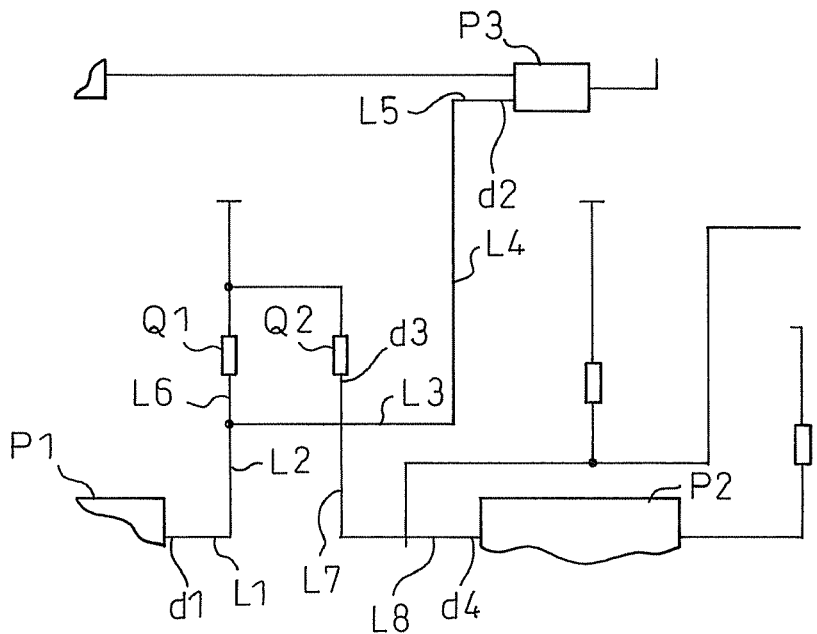
FIGS. 17A and 17B are views showing an example of attaching a line marker when the set unit of the line marker is between pins.
Figure 17B:
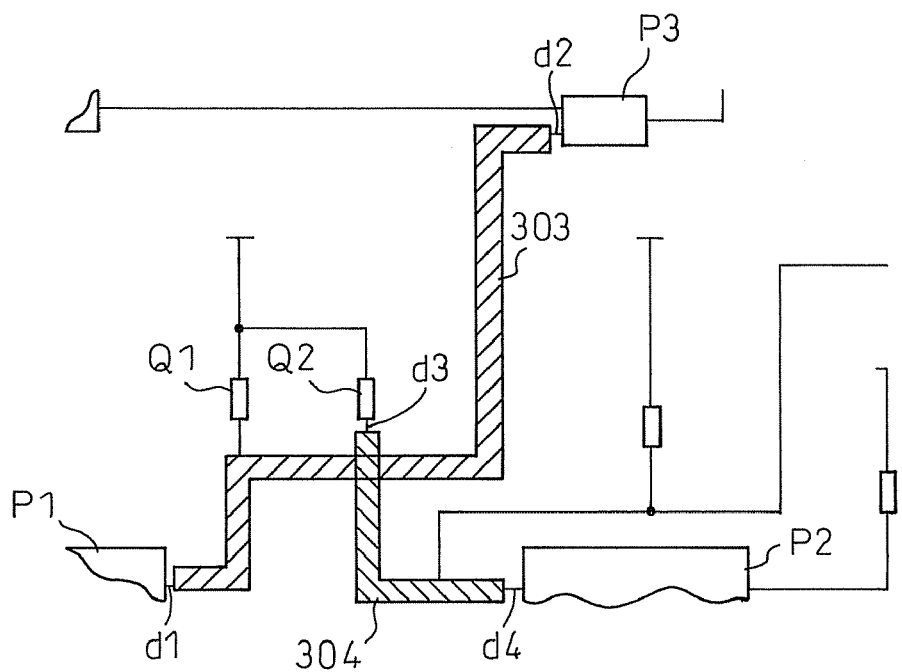

FIGS. 17A and 17B show the case where the set unit is between pins. When the set unit is between pins, component pins at the two ends where a line marker are set are successively selected from the screen. As shown in FIG. 17A, if selecting the pin d1 of the component P1, then selecting the pin d2 of the component P3, as shown in FIG. 17B, a marker 303 corresponding to the net to which the pins d1 and d2 belong is set and displayed. Next, when selecting the pin d3 of the component Q2 from the screen of FIG. 17A, then selecting the pin d4 of the component P2, as shown in FIG. 17B, a marker 304 is set and displayed between the pins d3 and d4. Note that when selecting the pin d1, then selecting the pin d3, it is judged that the selection of the pin d1 has been cancelled and the first pin d3 has been newly selected. That is, when selecting a first pin, then selecting a second pin belonging to a net different from that of the first pin, it is deemed that the selection of the first pin has been cancelled and that the second pin is newly selected.

Figure 18:
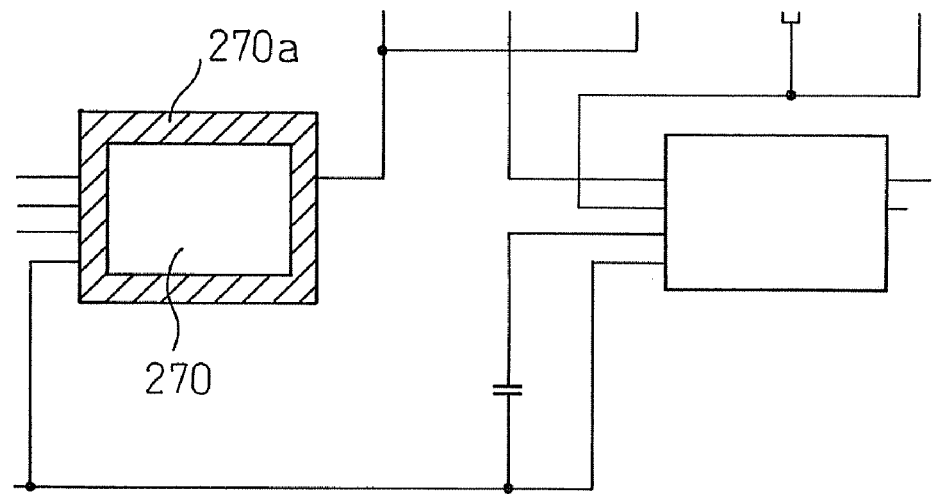
FIG. 18 is a view showing an example of attaching a line marker when the set unit of the line marker is a component.

FIG. 18 is a view of the state of display of a line marker in the case where the set unit is a component. As shown in FIG. 18, when the set unit is a component, if selecting the component 270, the line marker 270 is displayed as if surrounding the selected component 270. By successively selecting components on the screen, it is possible to attach line markers to a plurality of components.

Note that when attaching a line markers, if an existing line marker has already been attached, the later explained line marker delete mode may be used to delete the existing line marker and newly attach a line marker or the attributes can be directly changed. For example, a red line marker can be changed to green, a 0.1 mm line may be changed to 0.2 mm, or a line member may be changed to a connection member.

Figure 19:
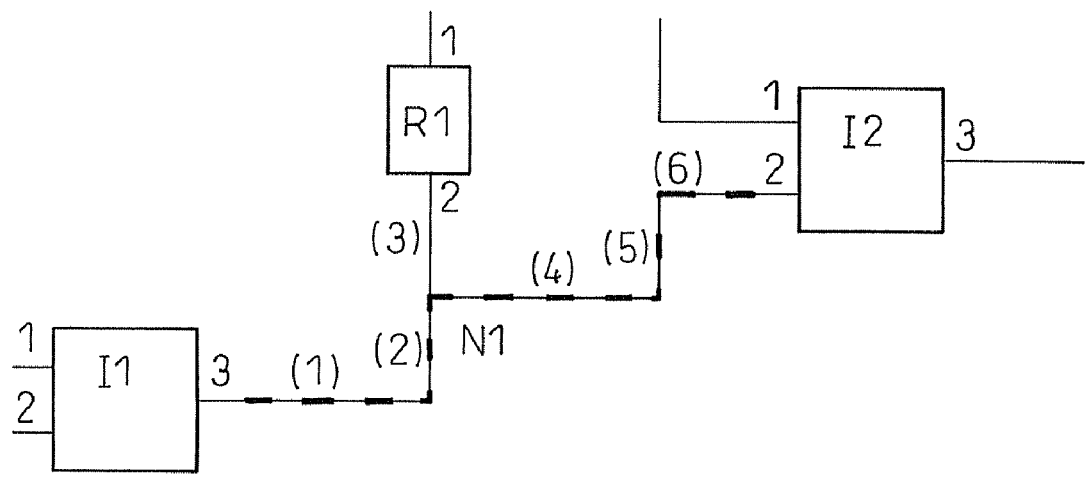
FIG. 19 is a view for explaining an example of the data structure of a line marker on a circuit diagram.
Figure 20:
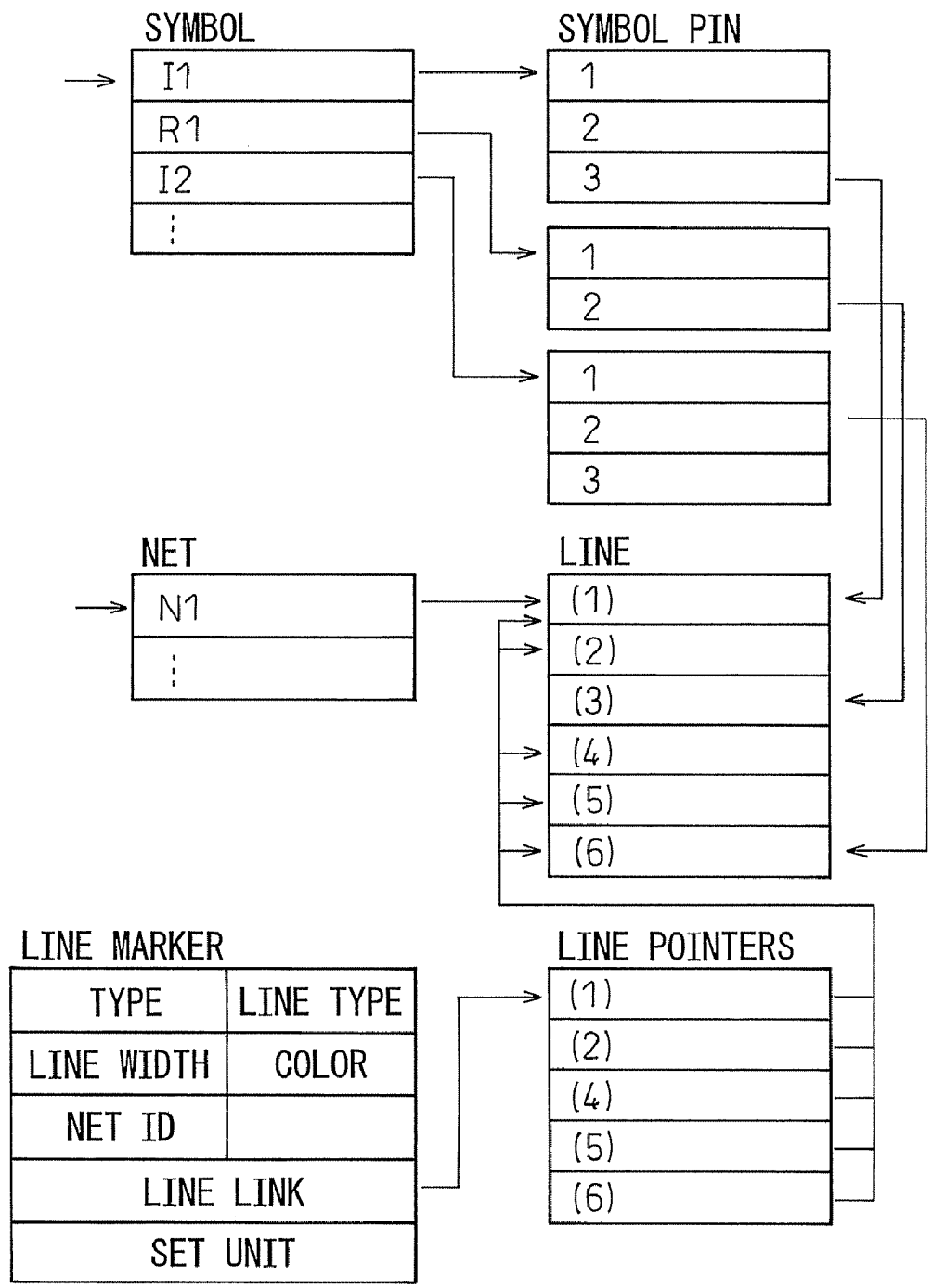
FIG. 20 is a view for explaining a table of examples of the data structure of a line marker of FIG. 19.

FIG. 19 and FIG. 20 show an example for explaining the data structure of line markers. FIG. 19 is a view for explaining the data structure of line markers on a circuit diagram, while FIG. 20 is a view for explaining the data structure on a table stored in a memory. In FIG. 19, a net N1 connecting the components I1, I2, and R1 is comprised of the lines (1) to (6). In the example of FIG. 19, the set unit of the line marker is set to between pins. Therefore, a broken line type line marker is attached between the connection pin 3 of the component I1 and the connection pin 2 of the component I2, that is, to the lines (1), (2), and (4) to (6). Note that this net N1 is not connected to any signal connector and is not connected to any component on another sheet, so the operation for attaching a line marker becomes the same when setting a line marker by a connection unit and setting it by a net unit.

The data structure corresponding to the line marker shown in FIG. 19 is stored as a table shown in FIG. 20. The table shown in FIG. 20 includes a table in which symbols expressing the components on the drawing, that is, component symbols, are set, a table in which the nets are set, and a table in which line marker attributes are set. Further, the component symbol table has a table set with information of the symbol pins expressing the corresponding component pins connected to it. The line marker table has a table set with line pointers corresponding to the lines to which a line marker has been attached connected to it. On the other hand, the net table has a table set with information regarding the lines forming the nets connected to it.

In the table illustrated in FIG. 20, the relationship between the component symbols I1, I2, and R1 and their symbol pins, the fact that the net N1 is comprised of the lines (1) to (6), the type of the line marker, line type, line width, color, net ID, line links, set units, etc. are stored. Further, the order of the lines (1), (2), and (4) to (6) to which a line marker has been attached is stored as line pointers. Further, the interrelationship of the symbol pins, lines, and line pointers are also stored.

In FIG. 20, the relationship between the symbols and symbol pins, the relationship between the nets and lines, and the relationship between the line markers and line pointers are shown by the arrow marks. The interrelationship among the symbol pins, lines, and line pointers is also shown by the arrow marks. For example, it is shown that the symbol I1 has the symbol pins 1 to 3, the symbol pin 3 is connected to the line (1), the line (1) is connected with the lines (2), (4), (5), and (6), and the line (6) is connected to the symbol pin 2 of the symbol I2. Further, the line pointers for a line marker are linked with the lines (1), (2), (4), (5), and (6) given the line marker and that order is shown.

When a line marker is to be deleted, the operator selects "edit"-"line marker"-"delete" from the menu bar. Alternatively, the operator selects a delete icon 203 for deleting a line marker from the tool bar shown in FIG. 13. Due to this, the line marker delete mode is entered. In the line marker delete mode, the line marker is deleted in accordance with the set unit when the line marker was set. For example, when the line marker was attached by a set unit of a line member, by selecting the line marker shown on the sheet, the line unit line marker is deleted. When the line marker was attached by a connection unit or net unit, the line marker is deleted by the connection unit or net unit.

During deletion of a line marker, only the line marker is selected. The other elements are not selected. Conversely, during editing of a circuit diagram, the line markers are not subject to selection and cannot be selected. After the line markers finish being deleted, "command end" is selected to end the line marker delete mode. Note that when a line, bus line, or component is deleted, the line marker of the deleted line, bus line, or component is also deleted.

Figure 21A:
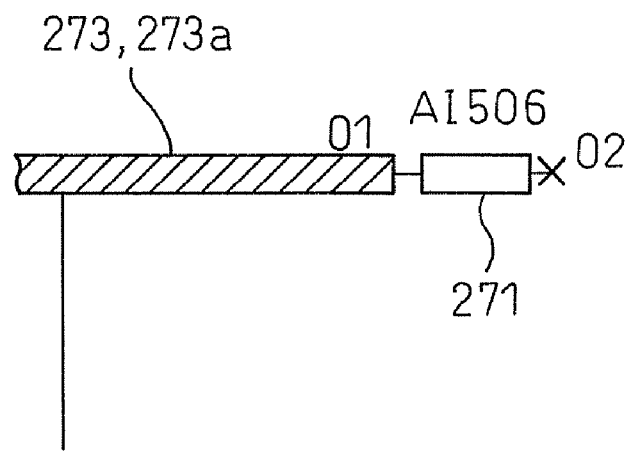
FIGS. 21A and 21B are views showing the movement of a line marker following an element having a line marker attached.
Figure 21B:
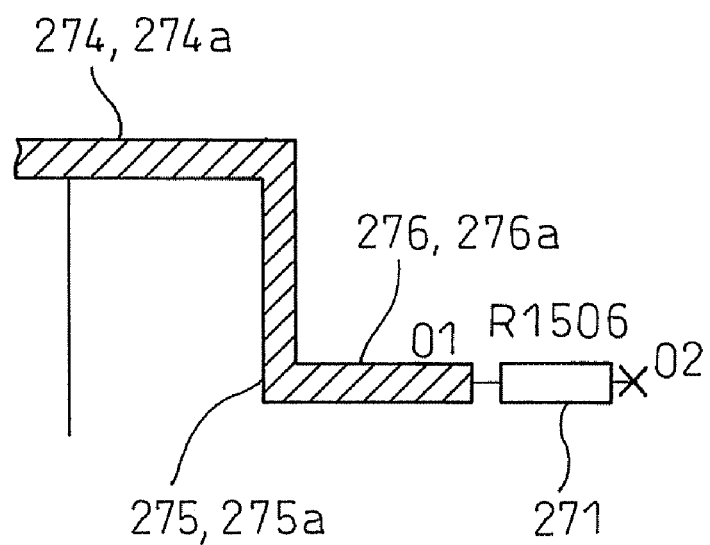

As shown in FIGS. 21A and 21B, when an element to which a line marker is attached, for example, a line, moves, the line marker follows the movement of that element. In FIG. 21A, when a line 273 connected to the component 271 is set with a line marker 273a, as shown in FIG. 20B, if the component 271 is moved, the connection line also is changed from the line 273 to the set of the lines 274, 275, and 276 along with that movement. The line markers follow the changed lines 274, 275, and 276 as the line markers 274a, 275a, and 276a.

Figure 22A:
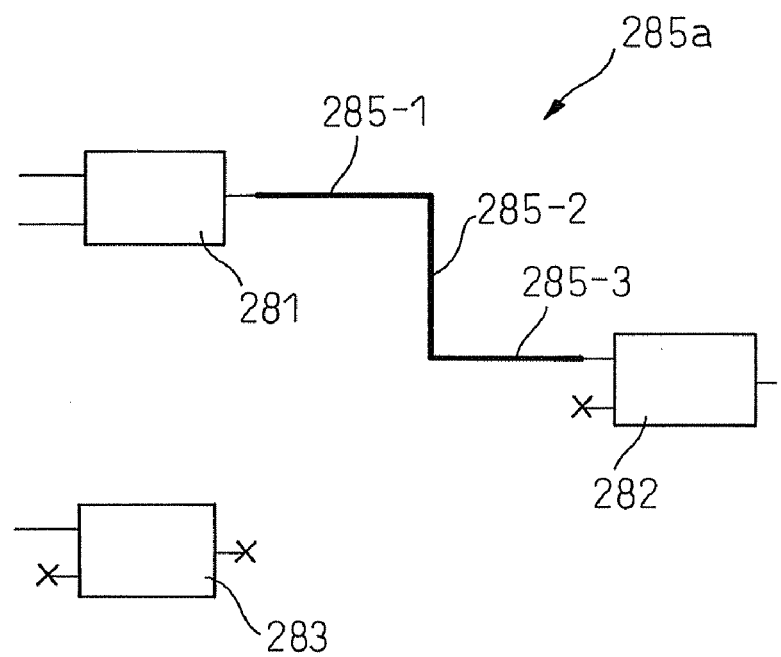
FIGS. 22A and 22B are views showing a line marker being automatically attached to combined elements when another element is combined with an element to which a line marker has been attached in a net unit.
Figure 22B:
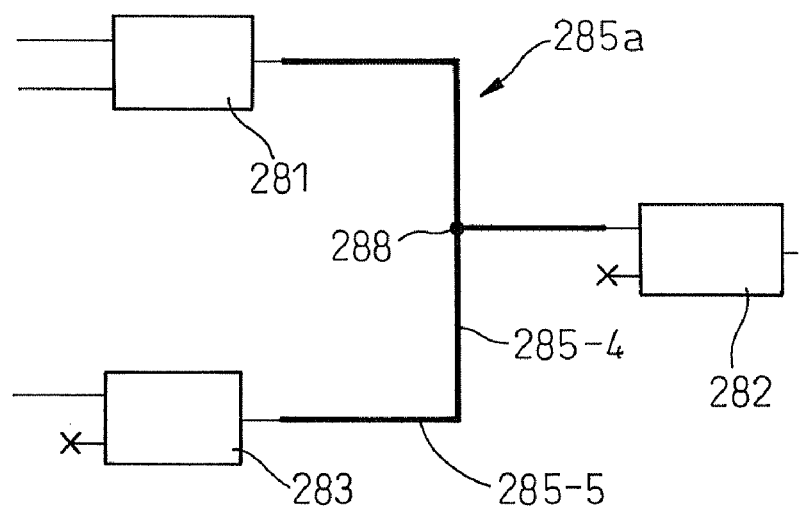

As shown in FIGS. 22A and 22B, when line marker is set in a net unit, if another element is combined with the elements to which a line marker is attached, the line marker follows this. A line marker is therefore given to the combined element. In FIG. 22A, the lines 285-1, 285-2, and 285-3 connecting the component 281 and the component 282 form a net which is set with the line marker 285a in a net unit. In this case, as shown in FIG. 22B, if newly setting the lines 285-4 and 285-5 at the connection point 288, the lines 285-4 and 285-5 become lines in the same net, so the line marker 285a is extended and automatically attached to the lines 285-4 and 285-5 as well.

Figure 23A:
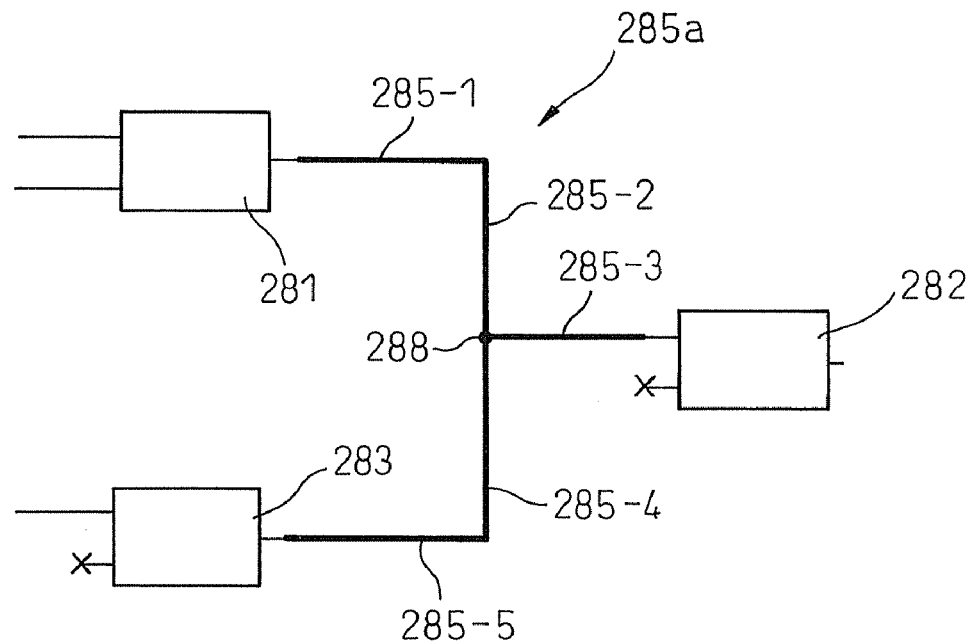
FIGS. 23A and 23B are views showing a line marker also following elements remaining in a net when elements to which a line marker is attached in a net unit are disconnected.
Figure 23B:
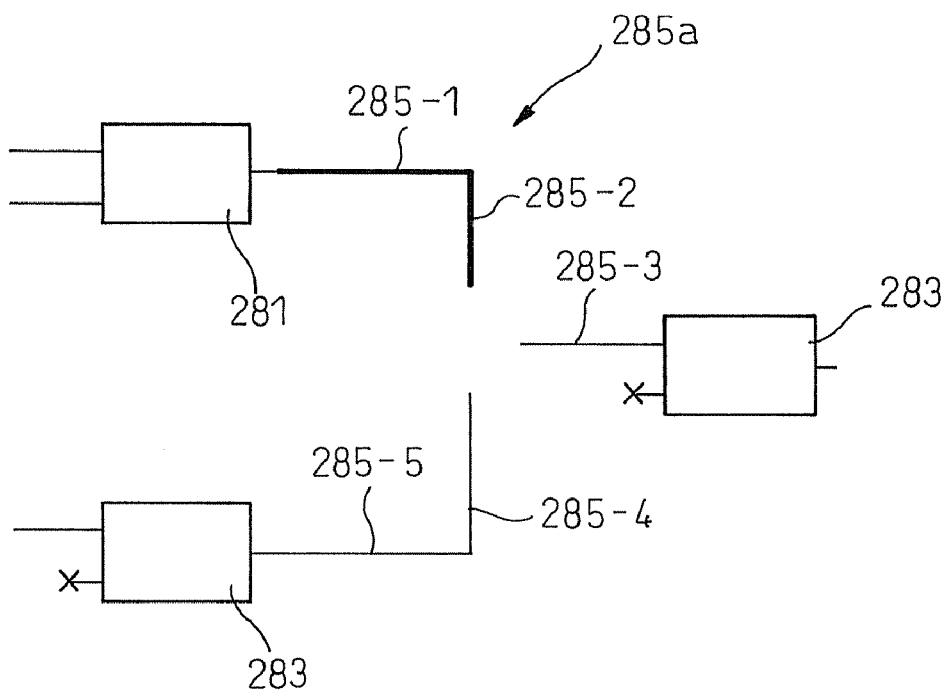

Conversely, when a line marker is attached in net units, if an element having the line marker is disconnected, only the line marker of the lines included in the net remains. For example, as shown in FIG. 23A, when a net comprised of the lines 285-1 to 285-5 is given the line marker 285a in a net unit, the net is disconnected at the connection point 288. The result becomes for example as shown in FIG. 21B. That is, in this example, the line 285-1 and the line 285-2 have the net name of before the disconnection of the net and have the line marker 285a still attached. However, 285-3, 285-4, and 285-5 become lines belonging to other nets. The line marker 385a attached in the net unit is also deleted. Note that which lines belong to the net before disconnection is preset.

When copying an element with a line marker, whether or not the line marker is to be copied following this may be set as an option. Further, the line markers displaying the surroundings of a component are moved or rotated following any movement or rotation of that component.

Figure 24A:
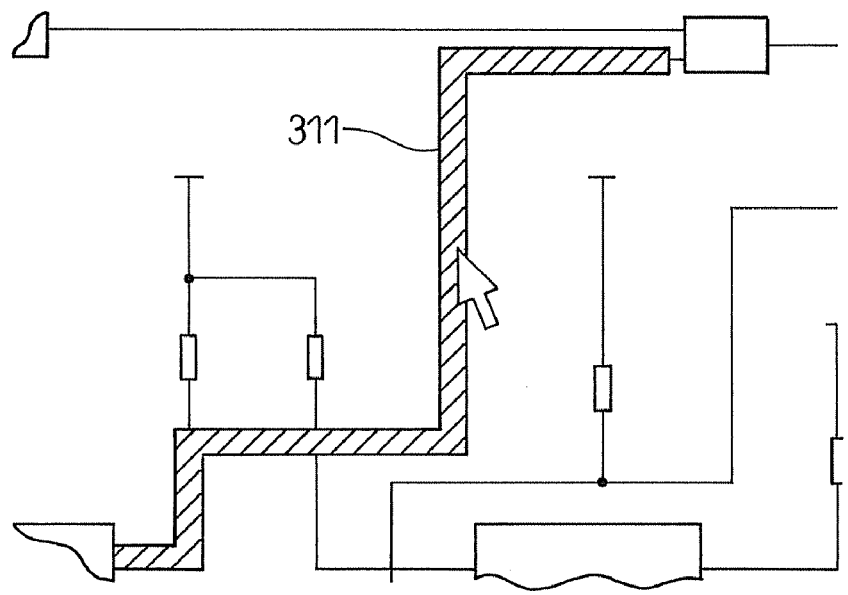
FIGS. 24A and 24B are views for explaining the operation of a line marker attribute change mode.
Figure 24B:
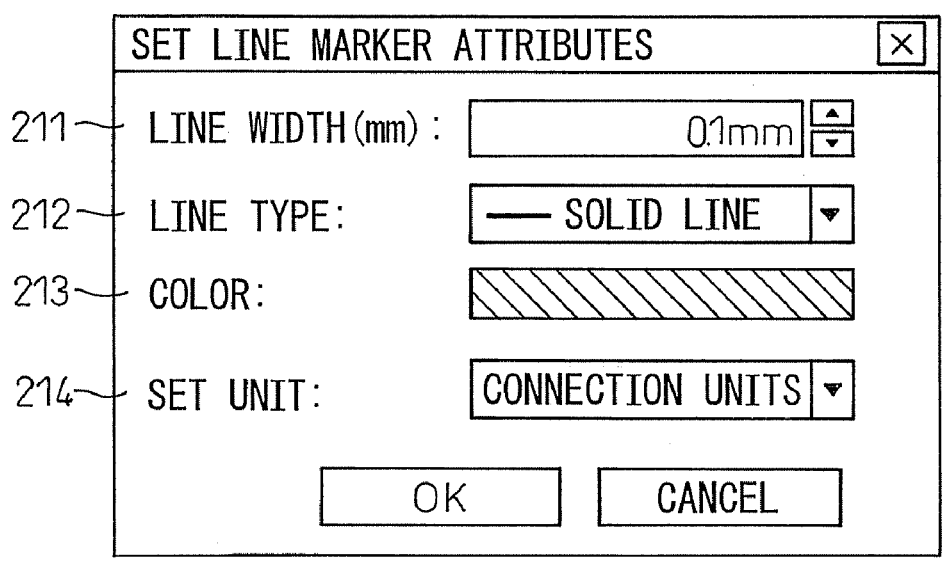

When changing a line marker in line width, line type, color, or other attribute, if selecting "edit"-"line marker"-"attribute" on the menu bar or clicking on the attribute change icon 204 of the tool bar shown in FIG. 13, the line marker attribute change mode is entered enabling change of the attributes of a line marker. In the line marker attribute change mode, a line marker may be selected and changed in attributes. For example, when desiring to change the attributes (line width, line type, or color) of the line marker 311 for the line shown in FIG. 24A, the line marker 311 is selected in the line marker attribute change mode. Due to this, as shown in FIG. 24B, a dialog for setting the line marker attributes similar to that of FIG. 13B is started up and displayed. However, in FIG. 24B, the set unit box 214 is not selectable. The line width setting box 211, line type setting box 212, and color setting box 213 of the attribute setting panel can be used to determine the desired line width, line type, and color, then the OK button pushed to change the line marker 311 in line width, line type, and color.

Figure 25:
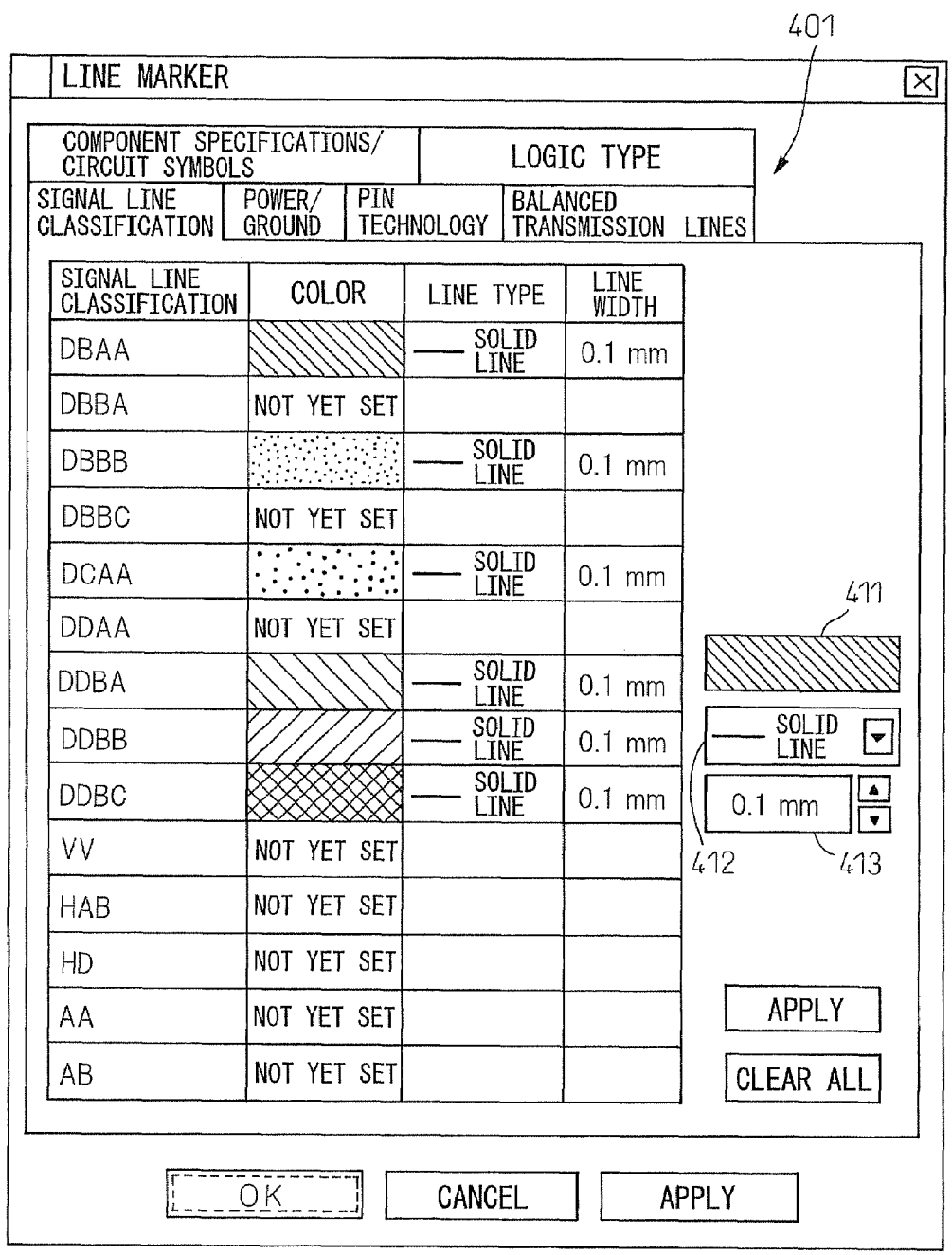
FIG. 25 is a view for explaining the operation for setting line markers.

On the other hand, if clicking on the collective setting icon 202 of the line marker tool bar shown in FIG. 13, the collective setting dialog shown in FIG. 25 is displayed. It is possible to select a tab 401 and collectively set or delete line markers for all elements having specific attributes. In FIG. 25, the signal line segment tab is selected. Each signal line segment can be set in color, line type, and line width using a color setting box 411, line type setting box 412, and line width setting box 413. The color may be selected by selecting the color setting box 411, whereby a usual color palette is displayed, and selecting a specific color or by creating any other color. The line type and the line width may be selected by display of lists in their respective boxes.

The elements for which line markers may be set and the marking method when the collective setting dialog tab 401 is selected are as explained below.

Regarding the component specifications/circuit symbol names, it is possible to draw boxes surrounding the symbols for the symbols of all portions having designated component specifications.

Regarding the logic types, it is possible to draw boxes surrounding the symbols for all portions having designated logic types.

Regarding the signal line segments, it is possible to draw the line markers on all lines of all nets having designated signal line segments.

Regarding the power/ground, it is possible to draw line markers on all lines of the designated power/ground except at the power/ground symbols.

Regarding the pin technology, it is possible to draw line markers on all lines of all nets having designated pin attributes.

Regarding balanced transmission lines, it is possible to draw line markers on all lines of all nets having the designated balanced transmission lines.

Whether or not to display the line markers on the screen may be determined as an option. Further, whether or not to print line markers may also be determined as an option. The default in printing is "do not print". Note that, when there are no line markers, the line marker options cannot be selected.

FIG. 26A shows a list of component information displayed on the screen, while FIG. 26B shows a list of net information displayed on the screen. The lists of component information and net information, as seen from the component name I50 and net name AGCSELT4, display the components and nets given line markers by the same colors as the colors used for the line markers. However, for net information, this is limited to the case of setting line markers in net units.

Further, in the lists of the component information and net information, the line markers may be used to narrow down the selection. FIG. 27A shows the case of selecting the filter item on the menu bar in the net information listing screen shown in FIG. 26B. Using the resultantly displayed pull down menu, it is possible to select items for instructing the conditions and set conditions for narrowing down the selection. FIG. 27B shows a condition instruction screen. As shown in the figure, it is possible to designate the narrowed down line markers by line type, line width, and color. The line type and line width are selected in the designation box by the display of a pull down list. The color is selected from a color on a color palette displayed in the designation box or other prepared color. Only the line markers matching the conditions designated here are displayed in the net information list.

Below, the flow of operations in event processing such as jump processing, bookmark processing, and line marker processing according to the present embodiment will be explained.

Figure 28:
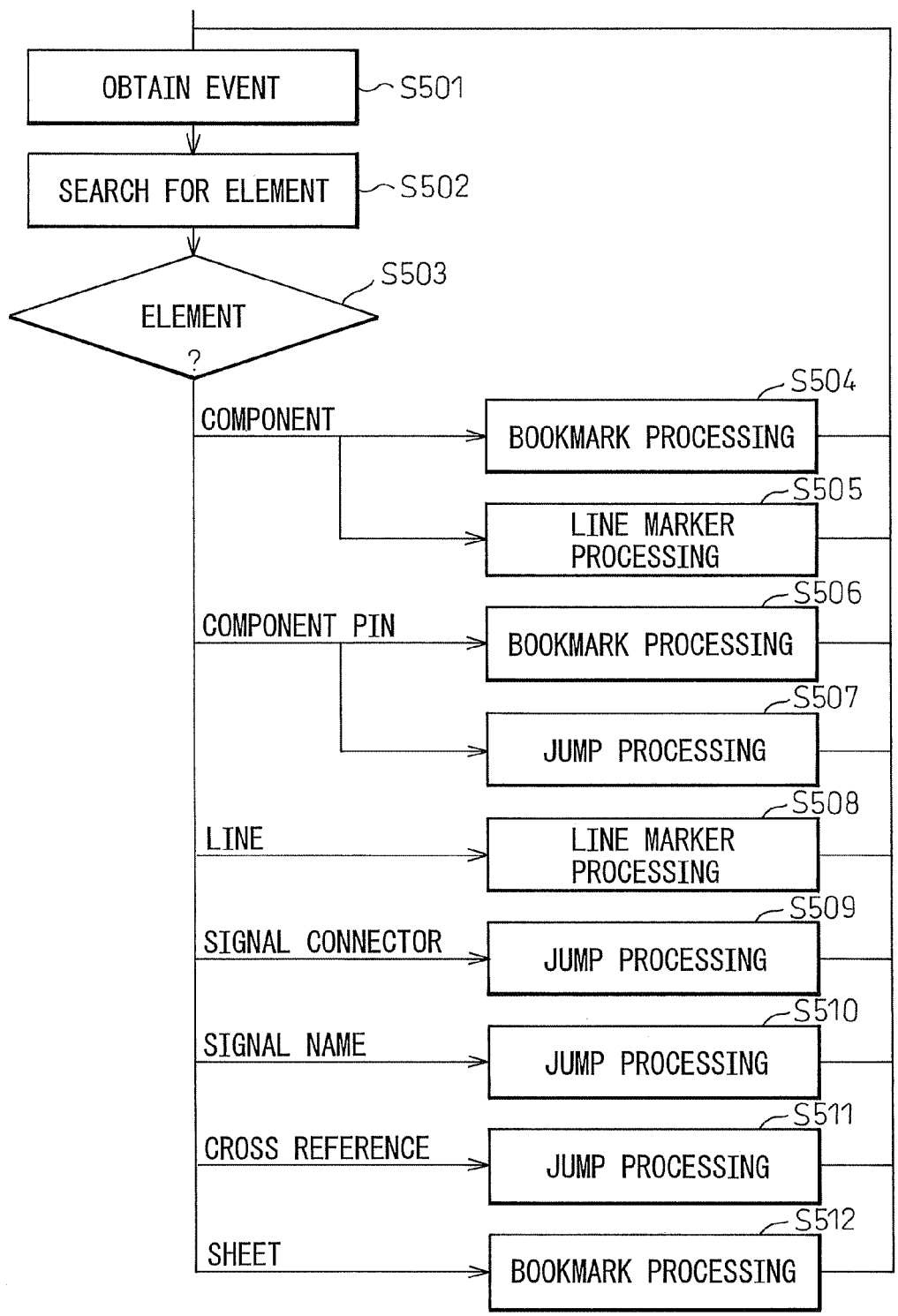
FIG. 28 is a view for explaining an outline of event processing in the present embodiment.

FIG. 28 shows the event processing executed in the circuit diagram drafting system shown in FIG. 1. First, an event arising due to an instruction by an operator is obtained (S501) and the element covered by the event is searched for (S502). It is judged if the retrieved element is a component, component pin, line, signal connector, signal name, cross reference, or sheet (S505).

If the element is a component, the processing is processing relating to a bookmark or processing relating to a line marker, so the bookmark processing by the bookmark managing unit 63 (S506) or the line marker processing by the line marker managing unit 61 (S505) is performed.

If the element is a component pin, the processing is processing relating to a bookmark or processing relating to a jump to another component pin, so the bookmark processing by the bookmark managing unit 63 (S506) or jump processing by the jump processing unit 40 (S507) is performed.

If the element is a line, the processing is processing relating to a line marker, so the line marker managing unit 61 performs line marker processing (S508). Note that as clear from this, in the present embodiment, processing for adding a bookmark to a line is not performed.

If the element is a signal connector, signal name, or cross reference, the processing is processing relating to a jump, so the jump processing unit 40 performs jump processing (S509, S510, and S511).

Further, when the element is not the above elements, but another sheet, it is judged that the processing is processing relating to a bookmark, so the bookmark managing unit 63 performs bookmark processing (S512).

Figure 29:
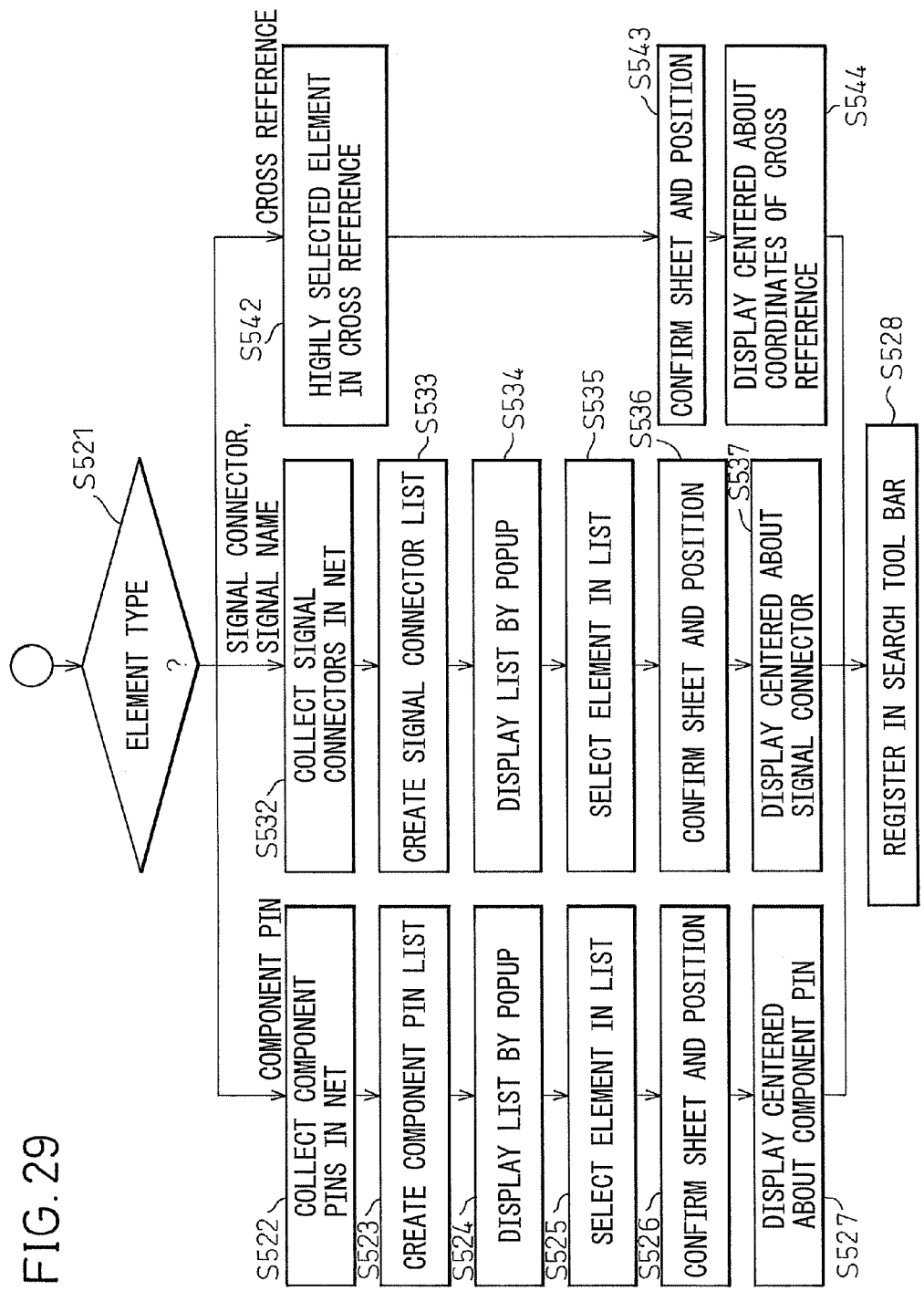
FIG. 29 is a view for explaining jump processing in event processing in the present embodiment.

Referring to FIG. 29, the jump processing in the jump processing unit 40 will be explained.

First, it is judged whether the element is a component pin, signal connector or signal name, or cross reference (S521).

If the element is a component pin, the component pins in the net are collected (S522) and a component pin list is created (S523). Note that if two-terminal components are set to be logically passed over, the component pins of the two-terminal components are not collected and are not entered in the component pin list. Next, the prepared component pin list is displayed by a popup (S524). The operator selects a component pin in the list (S525) and confirms the sheet with the selected component pin and position of the component pin (S526), then that sheet is displayed centered around the selected component pin (S527). After that, the component pin information is registered in the search tool bar (S528).

If the element is a signal connector or signal name, the signal connectors in the net are collected (S532) and a signal connector list is created (S533). Next, the prepared signal connector list is displayed by a popup (S534). The operator selects a signal connector in the list (S535) and confirms the sheet with the selected signal connector and the position of the signal connector (S536), then that sheet is displayed centered around the selected signal connector (S537). After that, the signal connector information is registered in the search tool bar (S528).

If the element is a cross reference, the selected cross reference is highlighted (S542). The operator confirms the sheet instructed by the cross reference and the position of the cross reference (S543), then the sheet is displayed centered about the coordinates of the cross reference (S544). After that, the information is registered in the search tool bar.

Figure 30:
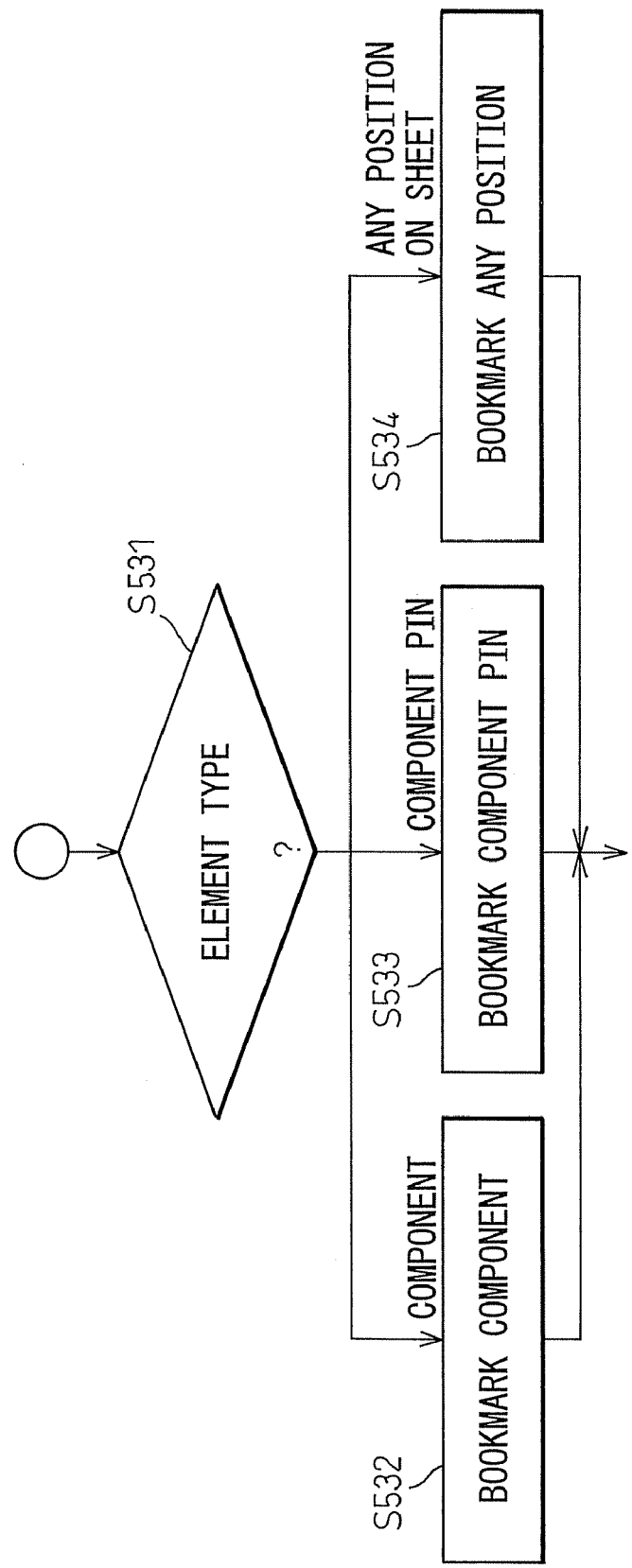
FIG. 30 is a view for explaining bookmark processing in event processing of the present embodiment.

Referring to FIG. 30, the processing for setting a bookmark in the bookmark processing unit will be explained. When the processing for setting a bookmark is started, first, the type of the element for which a bookmark is to be set is judged (S531). If the element is a component, the component is bookmarked (S532). If the element is a component pin, the component pin is bookmarked (S533). If the element is a sheet position, that position is bookmarked (S534).

Figure 31:
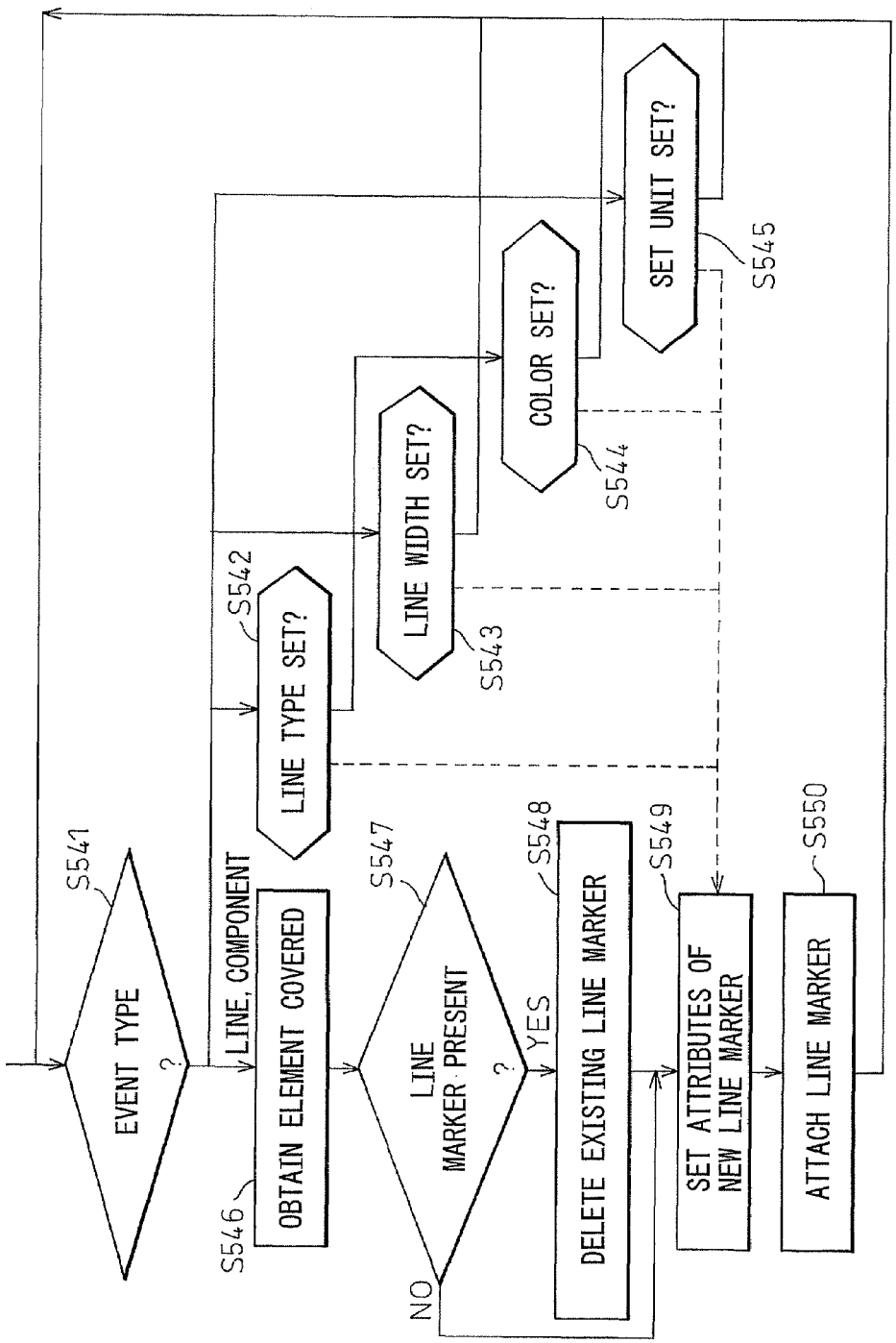
FIG. 31 is a view for explaining line marker processing in event processing in the present embodiment.

Referring to FIG. 31, the line marker processing in the line marker managing unit will be explained.

First, the type of the event is judged (S541). If processing for setting a line marker, the line type is set (S542), the line width is set (S543), the color is set (S544), and the set unit is set (S545). At step S541, if the type of the event is attachment of a line marker, whether the element to be given the line marker is a line or component is obtained (S546). Next, it is judged if there is any existing line marker (S547). If there is any existing line marker, it is deleted (S548). Next, if necessary, attributes of a new line marker are set (S549), then the designated element is given a line marker (S550). At step S547, if there is no existing line marker, step S548 is skipped and, if necessary, the attributes of a new line marker are set (S549), then the designated element is given the line marker (S550).

In the embodiments of the present invention explained above, line markers can be attached in set units corresponding to the characteristics of the circuit diagram, so the work of attaching line markers becomes more efficient. Further, even if a circuit design is reworked, since the verified lines are already given verified line markers, it is possible to save on the time and effort of verification. The line markers can be set so as to follow changes or copying of the circuit. Further, there are a jump function, bookmark function, pass over of a two-terminal function, etc. Therefore, the work of circuit verification and line marker attachment can be performed efficiently.

While the invention has been described with reference to specific embodiments chosen for purpose of illustration, it should be apparent that numerous modifications could be made thereto by those skilled in the art without departing from the basic concept and scope of the invention.

What is claimed is:

1. A circuit diagram drafting system for drafting a circuit diagram comprised of a plurality of circuit components and connections connecting terminals of the circuit components, the circuit diagram drafting system comprising:
   a display unit to display the circuit diagram;
   a managing unit to attach and manage a line marker on a connection of the circuit diagram displayed on the display unit based on a line marker set unit selected from a plurality of line marker set units, wherein
      the set units include at least a line unit forming a route, inter-terminal unit designating connected terminals, and a net unit,
      the net unit includes connections spanning a plurality of sheets through signal connection terminals connected to terminals of the circuit components, and
      the line marker set units include a connection unit limited to a single sheet;
   a jump processing unit to start processing displaying a terminal of another circuit component connected to a terminal or signal connector when the terminal of the circuit component or signal connector is selected, wherein
      the jump processing unit performs processing for displaying a list of terminals of the other circuit components and displaying a selected terminal from the list and is set to pass over a two-terminal component, and two-terminal components are not displayed with the other circuit components in the list.

2. A circuit diagram drafting system as set forth in claim 1, wherein said line marker managing unit attaches a line marker to a periphery of said circuit component.

3. A circuit diagram drafting system as set forth in claim 1, further comprising:
   a bookmark managing unit to perform processing for adding a bookmark to a location of a circuit diagram and processing for executing a search using the added bookmark.

4. A circuit diagram drafting system as set forth in claim 1, wherein said line marker can be set in line type, line width, and color.

5. A circuit diagram drafting system as set forth in claim 1, wherein said line marker follows editing of said circuit component or said route given said line marker.

6. A circuit diagram drafting method for drafting a circuit diagram comprised of a plurality of circuit components and connections connecting terminals of the circuit components, the circuit diagram drafting method comprising:
   displaying the circuit diagram,
   attaching and managing a line marker on a connection of the circuit diagram displayed on the display unit based on a line marker set unit selected from a plurality of line marker set units, wherein the set units include at least a line unit forming a route, inter-terminal unit designating connected terminals, and net unit, the net unit includes connections spanning a plurality of sheets through signal connection terminals connected to terminals of the circuit components, and the line marker set units include a connection unit limited to a single sheet, and
   jump processing for starting displaying a terminal of another circuit component connected to a terminal or signal connector when the terminal of the circuit component or signal connector is selected, wherein the jump processing performs processing for displaying a list of terminals of the other circuit components and displaying a selected terminal from the list and is set to pass over a two-terminal component, and two-terminal components are not display with the other circuit components in the list.

7. A circuit diagram drafting method as set forth in claim 6, wherein said attaching and managing attaches a line marker to a periphery of said circuit component.

8. A circuit diagram drafting method as set forth in claim 6, further comprising:
   adding a bookmark to a location of the circuit diagram and executing a search using the added bookmark.

9. A circuit diagram drafting method as set forth in claim 6, wherein said line marker can be set in line type, line width, and color.

10. A circuit diagram drafting method as set forth in claim 6, wherein said line marker follows editing of said circuit component or said route given said line marker.

11. A computer program product storing a computer program, which when executed by a computer causes the computer to draft a circuit diagram comprised of a plurality of circuit components and connections connecting terminals of the circuit components, the computer program causes the computer to perform:
   displaying the circuit diagram; and
   attaching and managing a line marker on a connection of the circuit diagram displayed on the display unit based on a line marker set unit selected from a predetermined plurality of line marker set units, wherein the set units include at least a line unit forming a route, inter-terminal unit designating connected terminals, and net unit, the net unit includes connections spanning a plurality of sheets through signal connection terminals connected to terminals of the circuit components, and the line marker set units include a connection unit limited to a single sheet, and
   starting processing displaying a terminal of another circuit component connected to a terminal or signal connector when the terminal of the circuit component or signal connector is selected, wherein the function of jump processing performs processing for displaying a list of terminals of the other circuit components and displaying a selected terminal from the list and is set to pass over a two-terminal component, and two-terminal components are not displayed with the other circuit components in the list.

12. A computer program product as set forth in claim 11, wherein attaching and managing attaches a line marker to a periphery of said circuit component.

13. A computer program product as set forth in claim 11, wherein the computer program further causes the computer to perform adding a bookmark to a location of the circuit diagram and executing a search using the added bookmark.

14. A computer program product as set forth in claim 11, wherein said line marker can be set in line type, line width, and color.

15. A computer program product as set forth in claim 11, wherein said line marker follows editing of said circuit component or said route given said line marker.

* * * * *